(12) United States Patent
Fuchikami et al.

(10) Patent No.: US 10,818,355 B2
(45) Date of Patent: Oct. 27, 2020

(54) SEMICONDUCTOR MEMORY APPARATUS

(71) Applicant: ROHM Co., LTD., Kyoto (JP)

(72) Inventors: Takaaki Fuchikami, Kyoto (JP);
Kazutaka Miyamoto, Kyoto (JP);
Hiromitsu Kimura, Kyoto (JP);
Kazuhisa Ukai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/399,228

(22) Filed: Apr. 30, 2019

(65) Prior Publication Data
US 2019/0341109 A1 Nov. 7, 2019

(30) Foreign Application Priority Data
May 1, 2018 (JP) .................................. 2018-088034

(51) Int. Cl.
*G11C 11/22* (2006.01)
*G11C 14/00* (2006.01)
*G11C 11/412* (2006.01)

(52) U.S. Cl.
CPC ........ *G11C 14/0027* (2013.01); *G11C 11/221* (2013.01); *G11C 11/4125* (2013.01); *G11C 14/0054* (2013.01)

(58) Field of Classification Search
CPC ......... G11C 14/00; G11C 7/22; G11C 11/221; G11C 11/22; G11C 14/0072; G11C 11/419; G11C 29/08; G11C 29/50; G11C 7/18; G11C 11/2259; G11C 7/20; G11C 11/2275; G11C 14/0027

USPC ..... 365/145, 149, 207, 189.15, 154, 189.05, 365/189.08, 189.16, 196, 203, 109, 117, 365/156

See application file for complete search history.

(56) References Cited

U.S. PATENT DOCUMENTS

2016/0111138 A1* 4/2016 Izumi .................. G11C 11/2259
365/65

FOREIGN PATENT DOCUMENTS

JP 2016-081549 A 5/2016

* cited by examiner

*Primary Examiner* — Thong Q Le
(74) *Attorney, Agent, or Firm* — Chip Law Group

(57) ABSTRACT

Disclosed is a semiconductor memory device including a memory cell based on a static random access memory having a 6T or 4T2R configuration and including a first internal node, a second internal node, a first ferroelectric capacitor, and a second ferroelectric capacitor, the first ferroelectric capacitor and the second ferroelectric capacitor having respective first ends connected respectively to the first internal node and the second internal node. For recovering data stored in a non-volatile fashion in the first ferroelectric capacitor and the second ferroelectric capacitor, a first access transistor connected between the first internal node and a first bit line and a second access transistor connected between the second internal node and a second bit line are turned on, and respective capacitive components of the first bit line and the second bit line are used as load capacitances.

13 Claims, 19 Drawing Sheets

F I G. 1
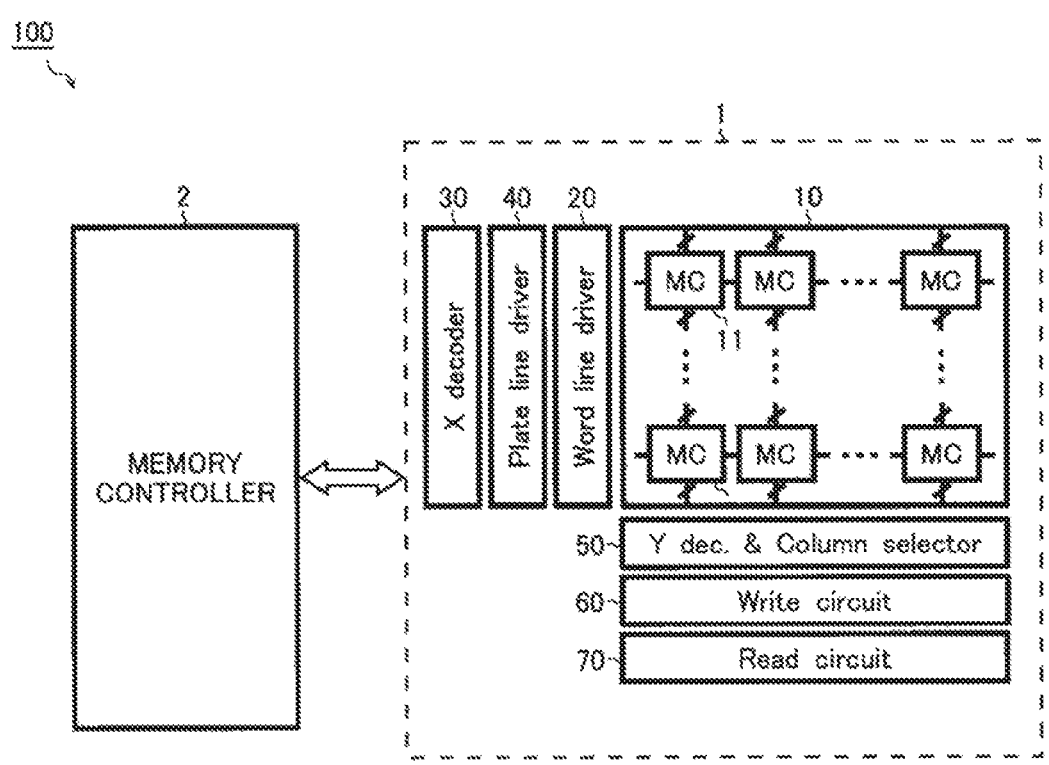

(a) write (b) read (c) store

F I G. 6
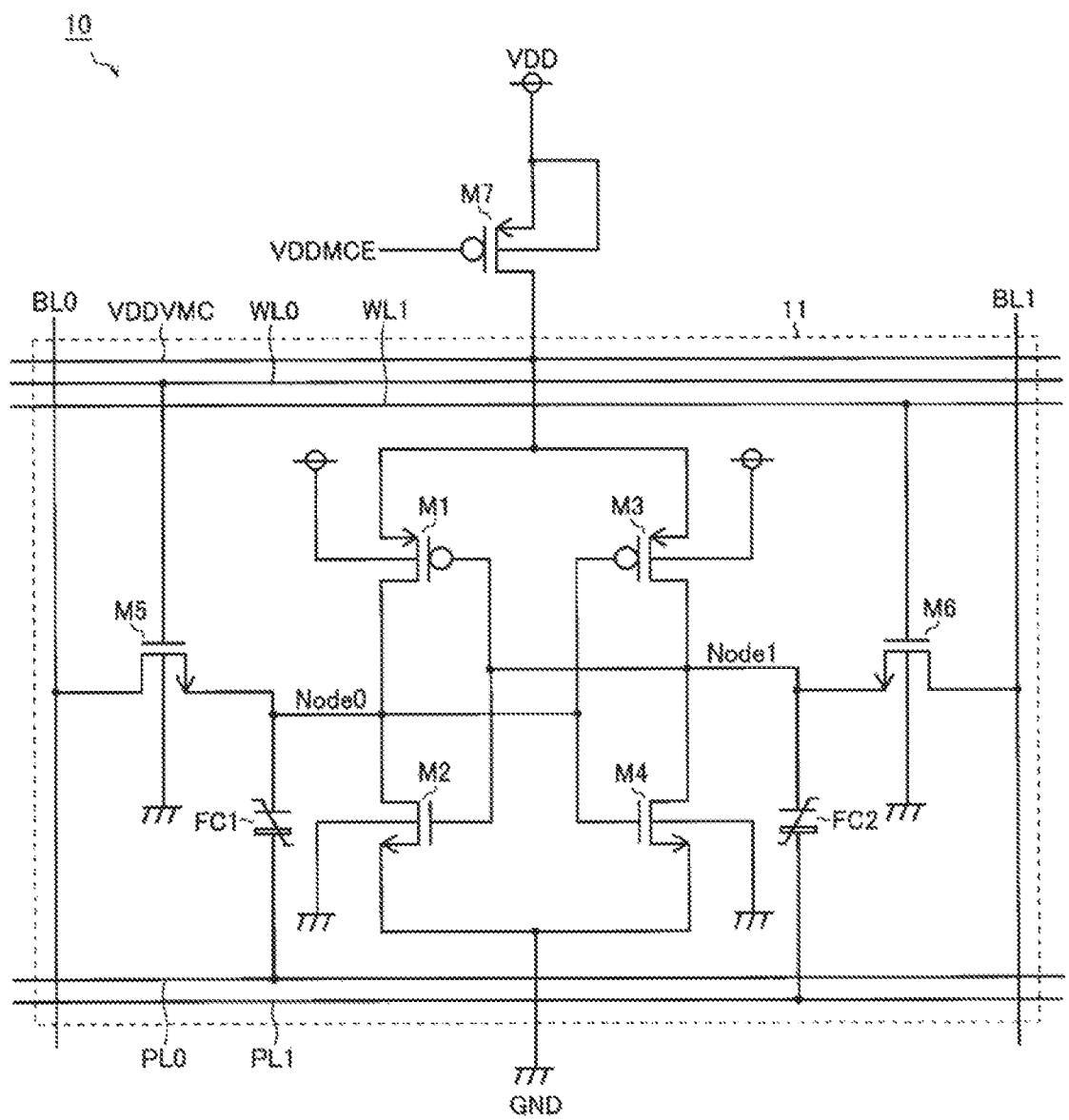

F I G. 1 2
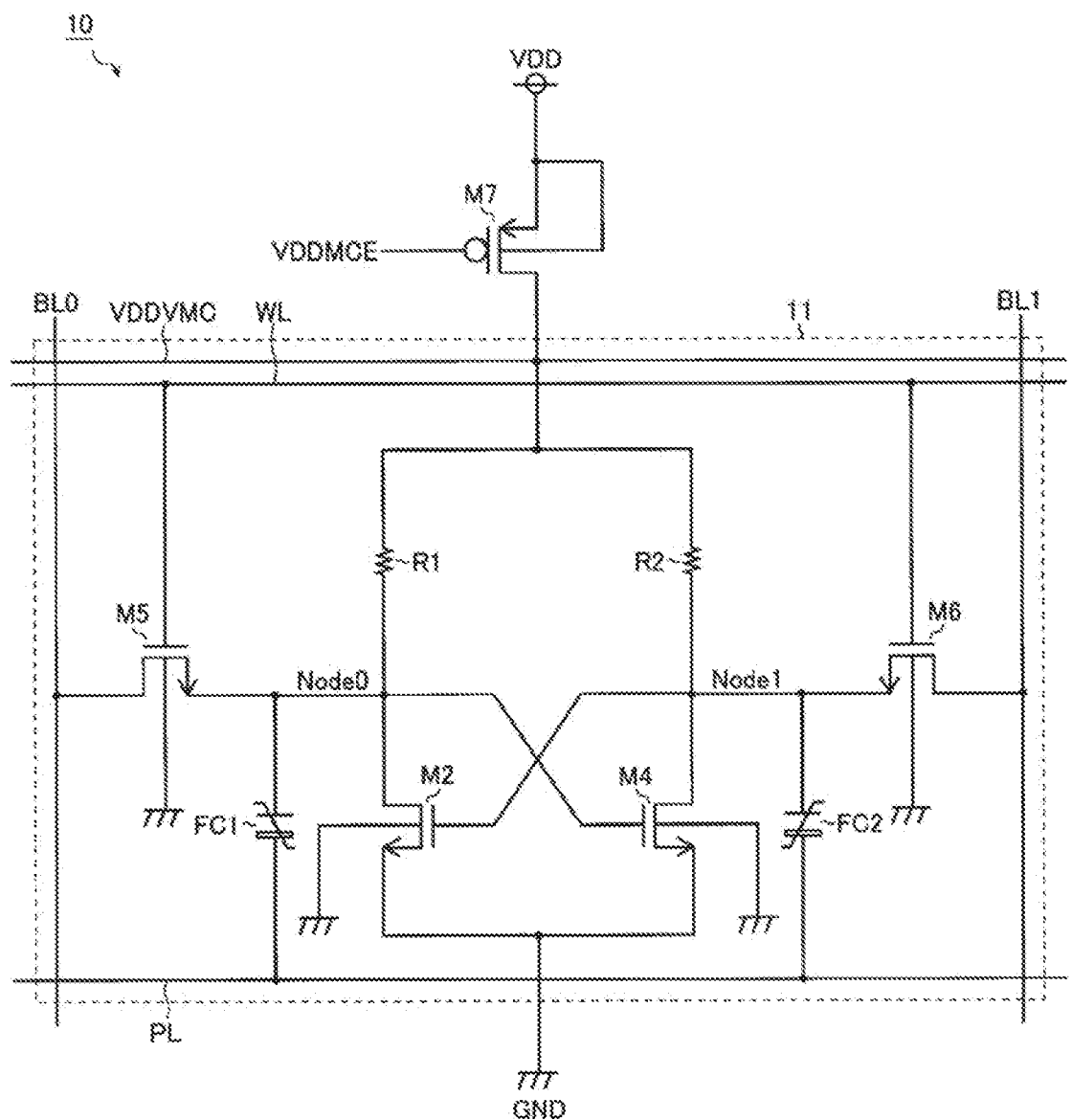

SEMICONDUCTOR MEMORY APPARATUS

CROSS REFERENCE TO RELATED APPLICATIONS

This US. application claims priority benefit of Japanese Patent Application No. JP 2018-088034 filed in the Japan Patent Office on May 1, 2018. Each of the above-referenced applications is hereby incorporated herein by reference in its entirety.

BACKGROUND

The present disclosure relates to a semiconductor memory device.

One non-volatile memory that has been put to practical use is an ferroelectric random access memory (Fe RAM) that uses ferroelectric capacitors. Applications of the FeRAM include a contactless IC card, for example. However, the FeRAM still remains to be improved in terms of memory speed in active mode, power consumption, and durability.

Heretofore, in order to solve the problems of the Fe RAM, there has been proposed an non-volatile random access memory (NVRAM) (hereinafter referred to as "ferroelectric shadow memory") having a 6T4C or 6T2C configuration that is a combination of an static RAM (SRAM) having a 6T configuration and ferroelectric capacitors.

When the ferroelectric shadow memory is in an active mode, i.e., when data are read from and written in the ferroelectric shadow memory, it operates as a 6T SRAM. When the ferroelectric shadow memory is in a standby mode, it stores data in the ferroelectric capacitors, making itself non-volatile. Therefore, the ferroelectric shadow memory is able to achieve both high-speed operation in the active mode and power saving, i.e., leakage current reduction, in the standby mode.

An example in the past that is relevant to the above related art is Japanese Patent Laid-Open No. 2016-81549.

However, there have been pointed out various problems to be solved for the above conventional ferroelectric shadow memory, including footprint reduction, power reduction, reliability improvement, and testability improvement. Consequently, the conventional ferroelectric shadow memory still remains to be improved for use in practical applications.

SUMMARY

It is desirable to provide a more practical semiconductor memory device in view of the problems that have heretofore been found by the inventor of the present disclosure.

According to an embodiment of the present disclosure, there is provided in accordance with a first aspect of the present disclosure a semiconductor memory device including a memory cell based on an SRAM having a 6T or 4T2R configuration and including a first internal node, a second internal node, a first ferroelectric capacitor, and a second ferroelectric capacitor, the first ferroelectric capacitor and the second ferroelectric capacitor having respective first ends connected respectively to the first internal node and the second internal node, in which for recovering data stored in a non-volatile fashion in the first ferroelectric capacitor and the second ferroelectric capacitor, a first access transistor connected between the first internal node and a first bit line and a second access transistor connected between the second internal node and a second bit line are turned on, and respective capacitive components of the first bit line and the second bit line are used as load capacitances.

According to a second aspect of the present disclosure, in the semiconductor memory device according to the first aspect, the first access transistor and the second access transistor have respective control ends connected respectively to a first word line and a second word line that are separate from each other.

According to a third aspect of the present disclosure, in the semiconductor memory device according to the first or second aspect, the first ferroelectric capacitor and the second ferroelectric capacitor have respective second ends connected respectively to a first plate line and a second plate line that are separate from each other.

According to a fourth aspect of the present disclosure, the semiconductor memory device according to any one of the first through third aspects further includes a local power supply line shared by a plurality of memory cells, and a switching transistor connected between a power supply terminal and the local power supply line.

According to a fifth aspect of the present disclosure, in the semiconductor memory device according to any one of the first through third aspects, the memory cell includes a pair of the switching transistors connected respectively between the power supply terminal and a pair of drive transistors or a pair of load resistors.

According to a sixth aspect of the present disclosure, in the semiconductor memory device according to any one of the first through third aspects, the memory cell includes a pair of the switching transistors connected respectively between the first internal node and the second internal node and a pair of the drive transistors or a pair of load resistors.

According to a seventh aspect of the present disclosure, in the semiconductor memory device according to any one of the first through third aspects, the memory cell includes a single switching transistor connected in common between the power supply terminal and a pair of the drive transistors or a pair of load resistors.

According to an eighth aspect of the present disclosure, in the semiconductor memory device according to any one of the first through third aspects, the memory cell includes a pair of the switching transistors connected respectively between the first internal node and the second internal node and the power supply terminal and, functioning as load resistors when turned on.

According to a ninth aspect of the present disclosure, the semiconductor memory device according to any one of the first through eighth aspects further includes a local ground line shared by a plurality of memory cells, and the switching transistor connected between a ground terminal and the local ground line.

According to a tenth aspect of the present disclosure, in the semiconductor memory device according to any one of the first through eighth aspects, the memory cell includes a pair of switching transistors connected respectively between a ground terminal and a pair of the drive transistors.

According to an eleventh aspect of the present disclosure, in the semiconductor memory device according to any one of the first through eighth aspects, the memory cell includes a pair of the switching transistors connected respectively between the first internal node and the second internal node and a pair of the drive transistors.

According to a twelfth aspect of the present disclosure, in the semiconductor memory device according to any one of the first through eighth aspects, the memory cell includes the single switching transistor connected in common between a ground terminal and a pair of the drive transistors.

According to a thirteenth aspect of the present disclosure, the semiconductor memory device according to any one of the first through twelfth aspects further includes a memory controller for controlling access to the memory cell.

According to a fourteenth aspect of the present disclosure, there is also provided a semiconductor memory device including a memory cell based on an SRAM having a 6T or 4T2R configuration and including a first internal node, a second internal node, a first ferroelectric capacitor, and a second ferroelectric capacitor, the first ferroelectric capacitor and the second ferroelectric capacitor having respective first ends connected respectively to the first internal node and the second internal node, in which a first access transistor connected between the first internal node and a first bit line and a second access transistor connected between the second internal node and a second bit line have respective control ends connected respectively to a first word line and a second word line that are separate from each other.

According to a fifteenth aspect of the present disclosure, there is further provided a semiconductor memory device including a memory cell based on an SRAM having a 6T or 4T2R configuration and including a first internal node, a second internal node, a first ferroelectric capacitor, and a second ferroelectric capacitor, the first ferroelectric capacitor and the second ferroelectric capacitor having respective first ends connected respectively to the first internal node and the second internal node, in which the first ferroelectric capacitor and the second ferroelectric capacitor has respective second ends connected respectively to a first plate line and a second plate line that are separate from each other.

According to the disclosure disclosed in the present description, the semiconductor memory device is highly practical in use as it is smaller in footprint, saves consumed electric power, is better in reliability, and has increased testability.

BRIEF DESCRIPTION OF THE DRAWINGS

FIG. 1 is a block diagram of an overall makeup of a semiconductor memory device according to an embodiment of the present disclosure;

FIG. 6 is a circuit diagram of a memory cell according to a third embodiment of the present disclosure;

FIG. 12 is a circuit diagram of a memory cell according to a ninth embodiment of the present disclosure;

DETAILED DESCRIPTION OF THE PREFERRED EMBODIMENTS

<Semiconductor Memory Device>

Figure 2:
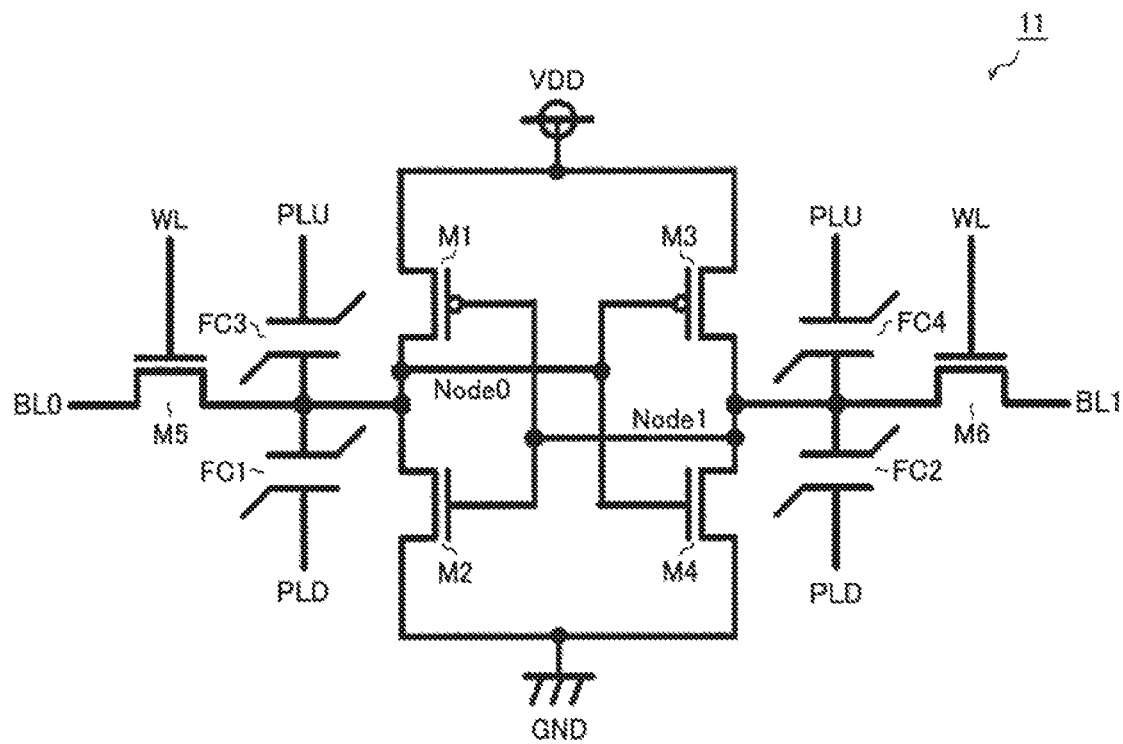
FIG. 2 is a circuit diagram illustrating a basic structure of a memory cell of the semiconductor memory device.

FIG. 1 illustrates in block form an overall makeup of a semiconductor memory device according to the present disclosure. As illustrated in FIG. 1, the semiconductor device, denoted by 100, includes a memory block 1 and a memory controller 2.

The memory block 1 is a circuit block for storing data therein, and includes a memory cell array 10, a word line driver 20, an X decoder 30, a plate line driver 40, a Y decoder and column selector 50, a write circuit 60, and a read circuit 70. The memory controller 2 is a circuit block for controlling access to the memory block 1 and hence a plurality of memory cells 11 thereof, to be described below. The memory controller 2 should preferably be in the form of a central processing unit (CPU), for example.

The memory cell array 10 is made up of a matrix of memory cells 11. Each of the memory cells 11 may be a ferroelectric shadow memory having a 6T4C configuration, a 6T2C configuration, a 4T2R4C configuration, or a 4T2R2C configuration to be described in detail later. As illustrated in FIG. 2, each of the memory cells 11 is connected to word lines WL for access control in read/write operation, bit lines BL0 and BL1 for data input/output in read/write operation, and plate lines PLU and PLD for driving ferroelectric capacitors in store/recall modes. Structural and operational details of the memory cells 11 will be described in detail later.

The word line driver 20 drives those word lines WL that are connected to the memory cells 11 where data are to be read or written, among all the word lines WL, in response to commands from the X decoder 30. Other memory cells 11 where data are not to be read and written are also connected to the work lines WL driven by the word line driver 20.

The X decoder 30 drives word line driver 20 in response to commands from the memory controller 2.

The plate line driver 40 drives those plate lines PLU and PLD that are connected to the memory cells 11 where data are to be stored or recalled in response to commands from the X decoder 30.

The Y decoder and column selector 50 selectively connects those bit lines BL0 and BL1 that are connected to the memory cells 11 where data are to be read or written and the right circuit 60 or the read circuit 70 in response to commands from the memory controller 2.

The write circuit 60 drives the bit lines BL0 and BL1 depending on data to be written in the memory cells 11.

The read circuit 70 includes sense amplifiers for reading data from the memory cells 11 by comparing or differentially amplifying voltage values between the bit lines BL0 and BL1.

<Memory Cell>

FIG. 2 is a circuit diagram illustrating a basic structure of each of the memory cells 11. Each of the memory cells 11 illustrated in FIG. 2 is a ferroelectric shadow memory having a 6T4C or 6T2C configuration which is a combination of an SRAM having a 6T configuration that is made up of six transistors and four ferroelectric capacitors. Specifically, the memory cell 11 includes N-channel drive transistors M2 and M4 that are N-channel type metal oxide semiconductor field-effect transistors (NMOSFETs), P-channel drive transistors M1 and M3 that are P-channel type metal oxide semiconductor field-effect transistors (PMOSFETs), N-channel access transistors M5 and M6 (NMOSFETs), and ferroelectric capacitors FC1 through FC4. The drive transistors M1 and M3, the drive transistors M2 and M4, and the access transistors M5 and M6 will hereinafter be referred to simply as transistors M1 through M6, respectively, for the sake of convenience.

The transistors M1 and M3 have respective sources connected to the power supply terminal, i.e., a terminal for applying a power supply voltage VDD. The transistors M1 and M2 have respective drains connected to an internal node Node0 and the transistors M3 and M4 have respective gates also connected to the internal node Node0. The transistors M3 and M4 have respective drains connected to an internal node Node1 and the transistors M1 and M2 have respective gates also connected to the internal node Node1. The transistors M2 and M4 have respective sources connected to a ground terminal, i.e., a terminal for applying a ground voltage GND.

The transistors M1 and M2 jointly make up an inverter having an input terminal connected to the internal node Node1 and an output terminal connected to the internal node Node0. The transistors M3 and M4 jointly make up an inverter having an input terminal connected to the internal node Node0 and an output terminal connected to the internal node Node1. The transistors M1 through M4 thus function as an inverter loop connected between the internal node Node0 and the internal node Node1.

The transistor M5 is connected between the internal node Node0 and the bit line BL0, and is turned on and off depending on a voltage applied to the corresponding word line WL that is connected to the gate thereof. The transistor M6 is connected between the internal node Node1 and the bit line BL1, and is turned on and off depending on a voltage applied to the corresponding word line WL that is connected to the gate thereof.

The ferroelectric capacitor FC1 is connected between the internal node Node0 and the corresponding plate line PLD. The ferroelectric capacitor FC2 is connected between the internal node Node1 and the corresponding plate line PLD. The ferroelectric capacitor FC3 is connected between the internal node Node0 and the corresponding plate line PLU. The ferroelectric capacitor FC4 is connected between the internal node Node1 and the corresponding plate line PLU.

The internal nodes Node0 and Node1 of the memory cell 11 thus constructed function as storage nodes of the memory cell 11. Node voltages for the storage nodes are of voltage values depending on logic data "0" or "1" stored in the memory cell 11.

Figure 3A:
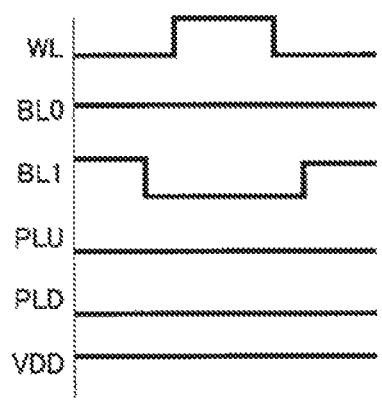
FIG. 3A is a timing chart illustrating an example of operation, i.e., write operation, of the memory cell.

FIGS. 3A, 3B, 3C and 3D are timing charts illustrating examples of operation of the memory cell 11. FIG. 3A illustrates an example of write operation, FIG. 3B an example of read operation, FIG. 3C an example of store operation, and FIG. 3D an example of recall operation. Each of FIGS. 3A, 3B, 3C and 3D illustrates signal levels on the work lines WL, the bit lines BL0 and BL1, the plate lines PLU and PLD, and the power supply voltage VDD corresponding to enable/disable states of the inverter loop, arranged in the order named successively from above.

When the memory cell 11 is in write operation, as illustrated in FIG. 3A, the word lines WL go high, turning on the transistors M5 and M6. At this time, providing the bit line BL0 is of a high level and the bit line BL1 is of a low level, the transistors M1, M4 are turned on and the transistors M2 and M3 are turned off. With the inverter loop being thus secured to such an operation state, the internal node Node0 is fixed at a high level and the internal node Node1 at a low level. This state represents a state in which logic data "1" is written in the memory cell 11, and is maintained even after the word lines WL go low as long as the power supply voltage VDD is supplied. Conversely, for writing logic data "0" in the memory cell 11, the bit line BL0 is set to a low level and the bit line BL1 to a high level during the period in which the word lines WL are high in level. When the memory cell 11 is in write operation, both the plate lines PLU and PLD are fixed at a low level.

Figure 3B:
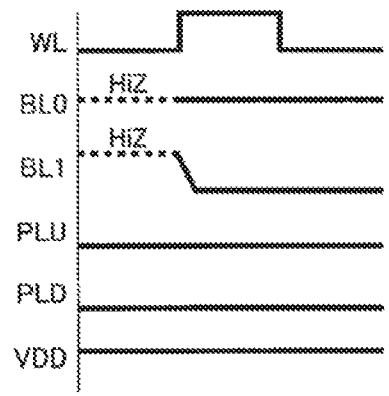
FIG. 3B is a timing chart illustrating an example of operation, i.e., read operation, of the memory cell.

When memory cell 11 is in read operation, as illustrated in FIG. 3B, the bit lines BL0 and BL1 are made floating, and the work lines WL go high to turn on the transistors M5 and M6. At this time, the voltages applied to the internal nodes Node® and Node1 appear on the bit lines BL0 and BL1. By comparing or differentially amplifying the voltages between the bit lines BL0 and BL1, it is possible to read whether the logic data written in the memory cell 11 is "1" or "0."

The memory cell 11 of a 6T4C configuration thus carries out read/write operation that is basically the same as with an SRAM having a 6T configuration.

Figure 3C:
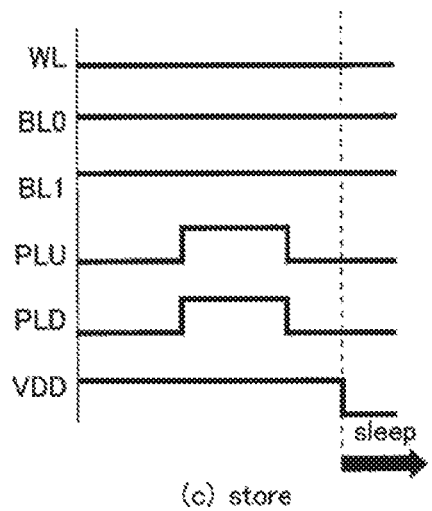
FIG. 3C is a timing chart illustrating an example of operation, i.e., store operation, of the memory cell.

Store operation of the memory cell 11 refers to the operation to transfer data from the internal nodes Node0 and Node1 to the ferroelectric capacitors FC1 through FC4 to make the memory cell 11 non-volatile. The memory cell 11 performs store operation when it changes from an active mode to a sleep mode, i.e., before the power supply voltage VDD supplied to the inverter loop is shut down. More specifically, when the memory cell 11 is in store operation, as illustrated in FIG. 3C, the plate lines PLU and PLD are pulse-driven to set the ferroelectric capacitors FC1 through FC4 to remanent polarization states.

For example, it is assumed that logic data "1" is stored in the memory cell 11, i.e., the internal node Node0 is of a high level and the internal node Node1 of a low level. While the plate lines PLU and PLD are low in level, no voltage is applied between the terminals of the ferroelectric capacitors FC2 and FC4 and voltages of opposite polarities are applied between the terminals of the ferroelectric capacitors FC1 and FC3. While the plate lines PLU and PLD are high in level, voltages of opposite polarities are applied between the terminals of the ferroelectric capacitors FC2, FE4 and no voltage is applied between the terminals of the ferroelectric capacitors FC1 and FC3. As a consequence, the ferroelectric capacitors FC1 through FC4 are set to such remanent polarization states that the ferroelectric capacitors FC1 and FC3 are of opposite polarities to each other, the ferroelectric capacitors FC2 and FC4 are of opposite polarities to each other, the ferroelectric capacitors FC1 and FC2 are of opposite polarities to each other, and the ferroelectric capacitors FC3 and FC4 are of opposite polarities to each other. If logic data "0" is stored in the memory cell 11, the ferroelectric capacitors FC1 through FC4 are set to remanent polarization states that are inverse to those described above.

Thereafter, the supply of the power supply voltage VDD is shut down to change the memory cell 11 from the active mode to the sleep mode. However, the ferroelectric capacitors FC1 through FC4 are kept in their remanent polarization states prior to the power supply shutdown. This state represents a state in which the data is transferred from the internal nodes Node0 and Node1 to the ferroelectric capacitors FC1 through FC4 to make the memory cell 11 nonvolatile.

Figure 3D:
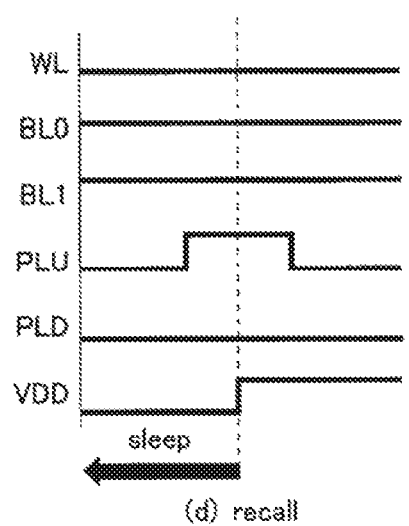
FIG. 3D is a timing chart illustrating an example of operation, i.e., recall operation, of the memory cell.

Recall operation of the memory cell 11 refers to the operation to restore the data from the ferroelectric capacitors FC1 through FC4 to the internal nodes Node® and Node1. The memory cell 11 performs store operation when it returns from the sleep mode to the active mode, i.e., before the supply of the power supply voltage VDD to the inverter loop is resumed. More specifically, when the memory cell 11 is in recall operation, as illustrated in FIG. 3D, one of the plate lines PLU and PLD is pulse-driven to induce voltages corresponding to the remanent polarization states of the ferroelectric capacitors FC1 through FC4 at the internal nodes Node0 and Node1.

For example, it is assumed that logic data "1" is stored in the ferroelectric capacitors FC1 through FC4. When the plate line PLU is switched from a low level to a high level, a voltage weak high (wkH) that is relatively higher than the internal node Node1 is induced at the internal node Node0 depending on the remanent polarization states of the ferroelectric capacitors FC1 and FC3.

A voltage weak low (wkL) that is relatively lower than the internal node Node0 is induced at the internal node Node1 depending on the remanent polarization states of the ferroelectric capacitors FC2 and FC4. In other words, a voltage difference depending on the remanent polarization states of the ferroelectric capacitors FC1 through FC4 is developed between the internal node Node0 and the internal node Node1.

Thereafter, when the supply of the power supply voltage VDD to the inverter loop is resumed, the internal node Node0 goes higher in level from the unstable voltage wkH and the internal node Node1 goes lower in level from the unstable voltage wkL due to the amplifying action of the inverter loop. This state represents a state in which the data is restored from the ferroelectric capacitors FC1 through FC4 to the internal nodes Node0 and Node1. If logic data "0" is stored in the ferroelectric capacitors FC1 through FC4, then voltages induced in the internal nodes Node0 and Node1 when the plate line PLU is pulse-driven are inverse to those described above.

Specific structural details of memory cells 11 according to various embodiments of the present disclosure will hereinafter be described in detail below.

First Embodiment

Figure 4:
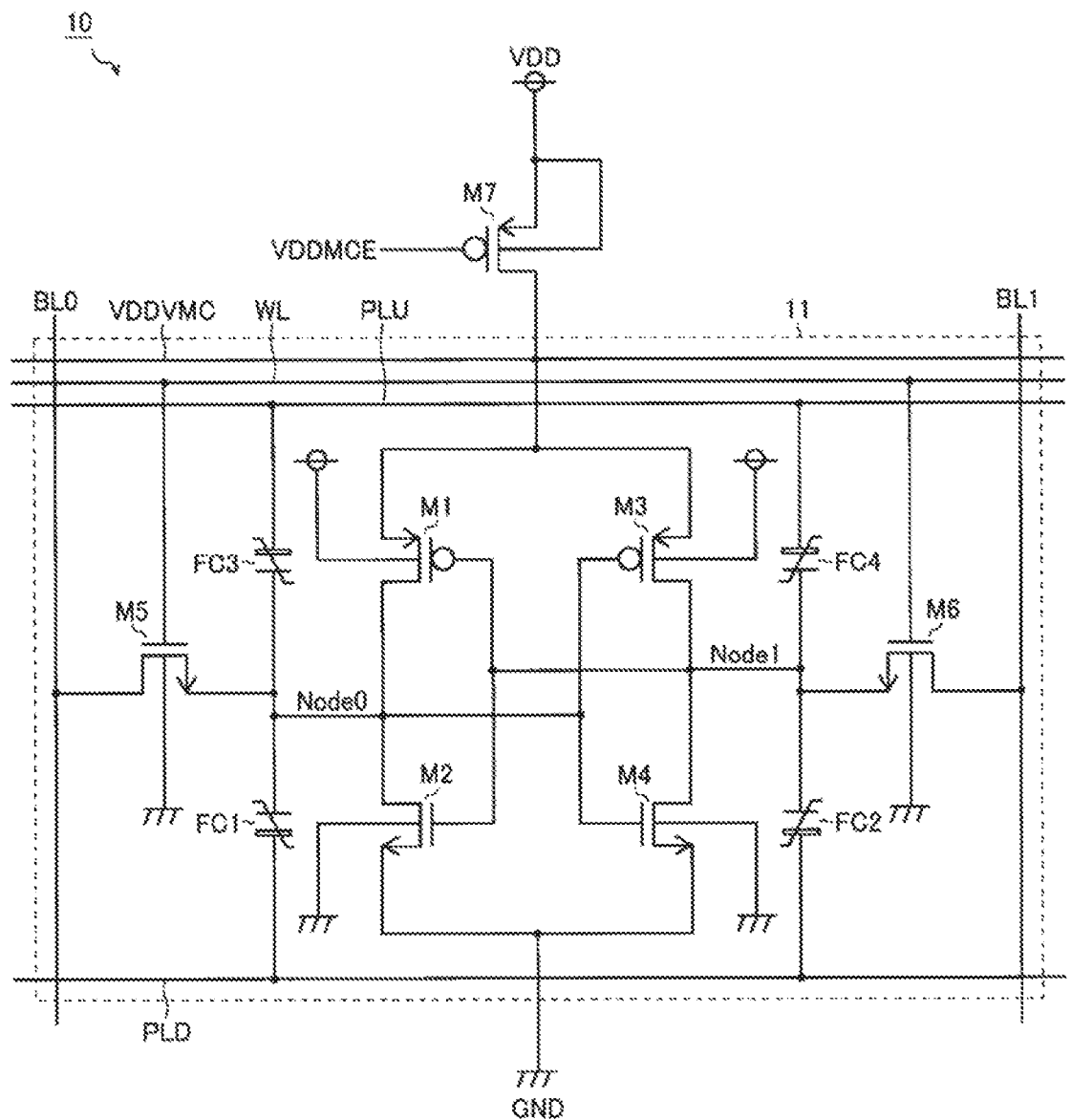
FIG. 4 is a circuit diagram of a memory cell according to a first embodiment of the present disclosure.

FIG. 4 is a circuit diagram of a memory cell 11 according to a first embodiment of the present disclosure. According to the first embodiment, the memory cell 11 is a ferroelectric shadow memory having a 6T4C configuration which is a combination of an SRAM having a 6T configuration and four ferroelectric capacitors, as with the basic structure (see FIG. 2) described above. The memory cell 11 according to the first embodiment will subsequently be referred to as a comparative example to be compared with memory cells according to second through seventh embodiments to be described later. Those parts of the memory cell 11 illustrated in FIG. 4 which are identical to those of the memory cell 11 illustrated in FIG. 4 are denoted by identical reference characters, and will not be described in detail below.

FIG. 4 also illustrates a P-channel switching transistor M7 (PMOSFET) as a peripheral component associated with the memory cell 11 according to the first embodiment. The switching transistor M7 will hereinafter be referred to as "transistor M7" for the sake of convenience. The transistor M7 has a source connected to the power supply terminal, i.e., a terminal for applying a power supply voltage VDD. The transistor M7 has a drain connected to the sources of the transistors M1 and M3 through a local power supply line VDDVMC. The local power supply line VDDVMC is shared by a plurality of (e.g., eight) adjacent memory cells 11. In other words, the transistor M7 is shared by a plurality of memory cells 11. Alternatively, one transistor M7 may be assigned to each memory cell 11, or may be assigned to each line of memory cells 11 or a plurality of lines of memory cells 11 of the memory cell array 10, or may be assigned to the memory cell array 10 in its entirety.

The transistor M7 has a gate connected to a terminal for applying an enable signal VDDMCE. Therefore, when the enable signal VDDMCE is of a low level, the transistor M7 is turned on, and when the enable signal VDDMCE is of a high level, the transistor M7 is turned off.

In the memory cell 11 according to the present embodiment, the transistors M5 and M6 have respective gates connected in common to a single word line WL. The ferroelectric capacitors FC1 and FC2 have respective ends connected in common to a single plate line PLD. The ferroelectric capacitors FC3 and FC4 have respective ends connected in common to a single plate line PLU.

The plate lines PLD and PLU are driven as follows: When the memory cell 11 is in write operation and read operation, the plate lines PLD and PLU are fixed at GND. If the power supply that is available is not a single power supply, but a special power supply voltage (VDD/2) is also available, then the plate lines PLD and PLU may be fixed at VDD/2. When the memory cell 11 is in store operation, the plate lines PLD and PLU are pulse-driven and thereafter the supply of electric power to the inverter loop is turned off. The memory cell 1 may be in recall operation according to a conventional method, an after-pulse method, or an on-pulse method. When the memory cell is in recall operation according to the conventional method, the plate lines PLD and PLU are fixed at VDD/2. When the memory cell is in recall operation according to the after-pulse method, the plate lines PLD and PLU are pulse-driven and thereafter the supply of electric power to the inverter loop is turned on or sensing is turned on. When the memory cell is in recall operation according to the on-pulse method, the plate lines PLD and PLU are pulse-driven, thereafter the supply of electric power to the inverter loop is turned on or sensing is turned on, after which the plate lines PLD and PLU are caused to go low in level.

A prototype of the memory cell 11 according to the present embodiment has been produced and operated. Since the memory cell 11 according to the present embodiment may require the four ferroelectric capacitors FC1 through FC4, however, it tends to suffer disadvantages in terms of making itself smaller in size, higher in speed, and lower in electric power consumption, and is also difficult to increase in degree of integration and liable to become poor in yield. In addition, much remains to be improved about testability.

There are proposed hereinbelow new embodiments that keep a basic structure of SRAMs and ferroelectric capacitors, but are concerned with improvements in circuit arrangements and operational processes for the memory cell 11, to achieve total higher performance through efforts to make the memory cell smaller in size, higher in speed, lower in electric power consumption, and better in reject rate.

Second Embodiment

Figure 5:
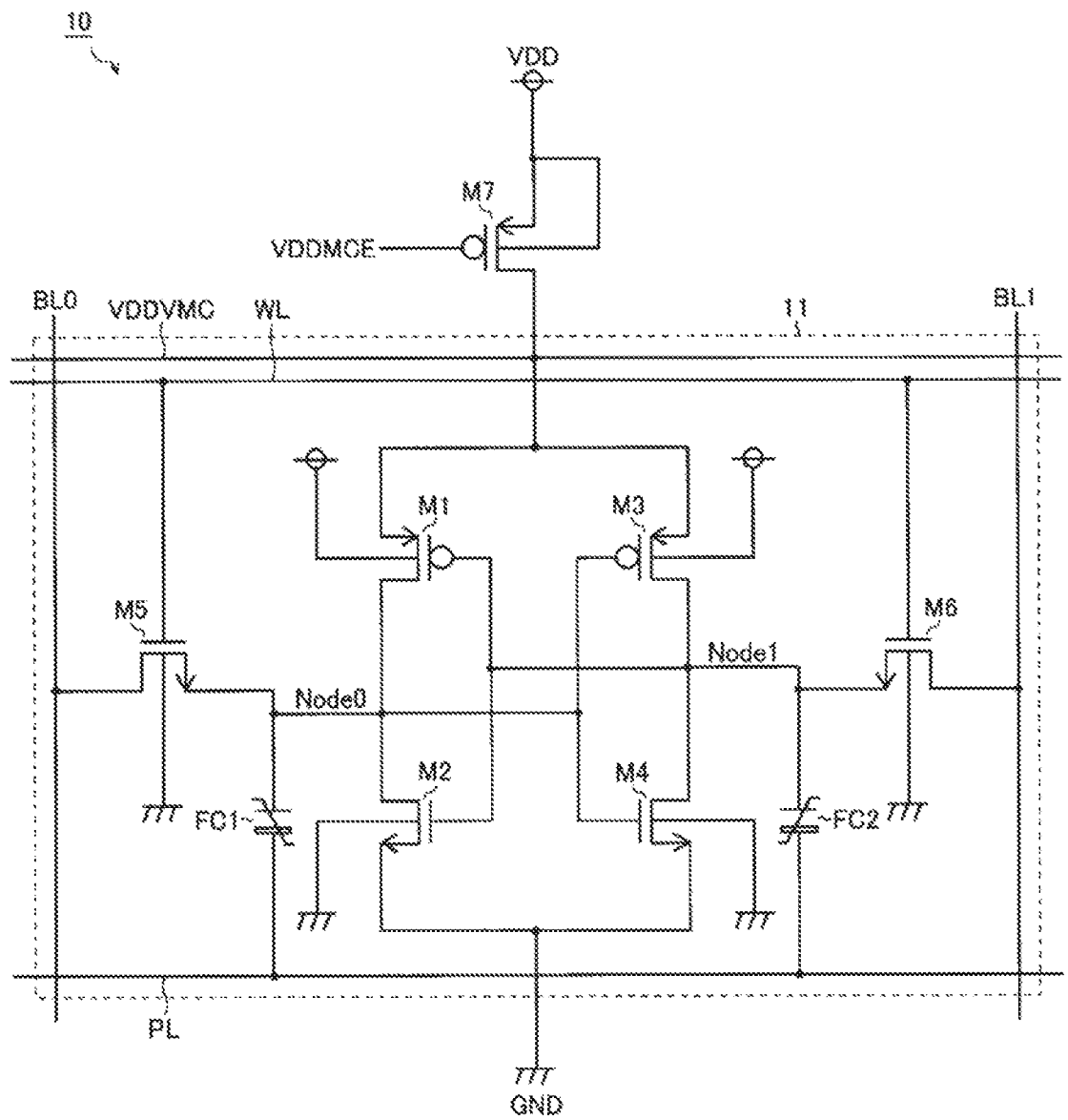
FIG. 5 is a circuit diagram of a memory cell according to a second embodiment of the present disclosure.

FIG. 5 is a circuit diagram of a memory cell 11 according to a second embodiment of the present disclosure. The memory cell 11 according to the present embodiment is based on the first embodiment (FIG. 4), but is a ferroelectric shadow memory having a 6T2C configuration, including the ferroelectric capacitors FC1 and FC2 and the plate line PLD (indicated as "FL" in FIG. 5 as there may be no need to distinguish from the plate line PLU) left and excluding the ferroelectric capacitors FC3 and FC4 and the plate line PLU. Conversely, the memory cell according to the present embodiment may include the ferroelectric capacitors FC3 and FC4 and the plate line PLU left and excluding the ferroelectric capacitors FC1 and FC2 and the plate line PLD.

Since the memory cell 11 according to the present embodiment has the number of ferroelectric capacitors reduced from 4 to 2, it can be made smaller in size, higher in speed, and lower in electric power consumption, i.e., smaller in instantaneous current, compared with the first embodiment.

Furthermore, the memory cell 11 according to the present embodiment can be operated under single-voltage control using only the power supply voltage VDD of 1.5 V, for example, and hence may not need a special power supply voltage VDD/2, for example. Consequently, the memory cell 11 according to the present embodiment is more advantageous in terms of making itself smaller in size, i.e., requiring no separate power supply circuit, higher in speed, i.e., requiring no separate power supply circuit waiting to be activated, and lower in electric power consumption, i.e., requiring no separate power supply circuit consuming electric power.

Recall operation of the memory cell 11 according to the present embodiment will be described below. It is assumed that the transistors M5 and M6 are turned off and the plate line PL is pulse-driven, for example. Then, a plurality of memory cells 11 that are connected in common to the bit lines BL0 and BL1 can simultaneously be in recall operation. However, as the ferroelectric capacitors FC3 and FC4 are deleted, the load capacitances of the internal nodes Node0 and Node1 are minute, i.e., only parasitic capacitors ancillary to the internal nodes Node0 and Node1, in recall operation, with the result that data corruption, i.e., erroneous reading, is likely to occur in recall operation.

When the memory cell 11 according to the present embodiment is in recall operation, it is desirable that the plate line PL be pulse-driven while the transistors M5 and M6 are turned on. In such recall operation, the respective capacitive components of the bit lines BL0 and BL1 can be used as the load capacitances. Accordingly, inasmuch as voltages corresponding to the remanent polarization states of the ferroelectric capacitors FC1 and FC2 can properly be induced at the internal nodes Node0 and Node1, data corruption, i.e., erroneous reading, is unlikely to occur in recall operation. However, it should be noted that when the transistors M5 and M6 are turned on, the plural memory cells 11 that are connected in common to the bit lines BL0 and BL1 may not simultaneously be in recall operation.

Parasitic capacitors originally ancillary to the bit lines BL0 and BL1 may be used or separate new capacitors may be introduced as the capacitive components of the bit lines BL0 and BL1. In the latter case, the newly introduced capacitors may be connected to the bit lines BL0 and BL1 only when in recall operation and may be disconnected from the bit lines BL0 and BL1 otherwise.

The ferroelectric capacitors FC1 and FC2 are disposed in the gaps between a plurality of contacts that provides conduction between an active region where the transistors M1 through M6 are formed and a metal interconnect layer, i.e., a lowermost layer, for example.

Third Embodiment

FIG. 6 is a circuit diagram of a memory cell 11 according to a third embodiment of the present disclosure. The memory cell 11 according to the present embodiment is based on the second embodiment (FIG. 5), but has the word line WL and the plate line PL separated into word lines and plate lines associated with left and right sections of the memory cell. More specifically, as illustrated in FIG. 6, the transistors M5 and M6 have respective gates connected respectively to word lines WL0, WL1 that are separate from each other. The ferroelectric capacitors FC1 and FC2 have respective ends connected respectively to plate lines PL0 and PL1 that are separate from each other.

As the word line WL and the plate line PL are separated into word lines and plate lines that are independent in the left and right sections of the memory cell, the ferroelectric capacitors FC1 and FC2 can independently be controlled or accessed, making it possible to achieve increased testability, i.e., design for testability (DFT) compatibility, of the memory cell 11.

In FIG. 6, the memory cell 11 according to the present embodiment is based on the second embodiment (FIG. 5). However, the memory cell 11 according to the present embodiment may be based on the first embodiment (FIG. 4), but the word line WL and the plate lines PLU and PLD may be separated into word lines and plate lines in the left and right sections of the memory cell 11 for increasing the testability thereof (WL→WL0/WL1, PLU→PLU0/PLU1, PLD→PLD0/PLD1).

In FIG. 6, the word lines WL0/WL1 and the plate lines PL0/PL1 are separate in the left and right sections of the memory cell. However, this does not mean that the memory cell 11 may not be tested unless both the word line WL and the plate line PL are separated. Either one of the word line WL and the plate line PL may be separated into lines in the left and right sections of the memory cell. According to a memory cell configuration where either one of the word line WL and the plate line PL may be separated into lines in the left and right sections of the memory cell, any increase in its interconnect area is reduced compared with a memory cell configuration where both the word line WL and the plate line PL are separated into lines in the left and right sections of the memory cell.

Fourth Embodiment

Figure 7:
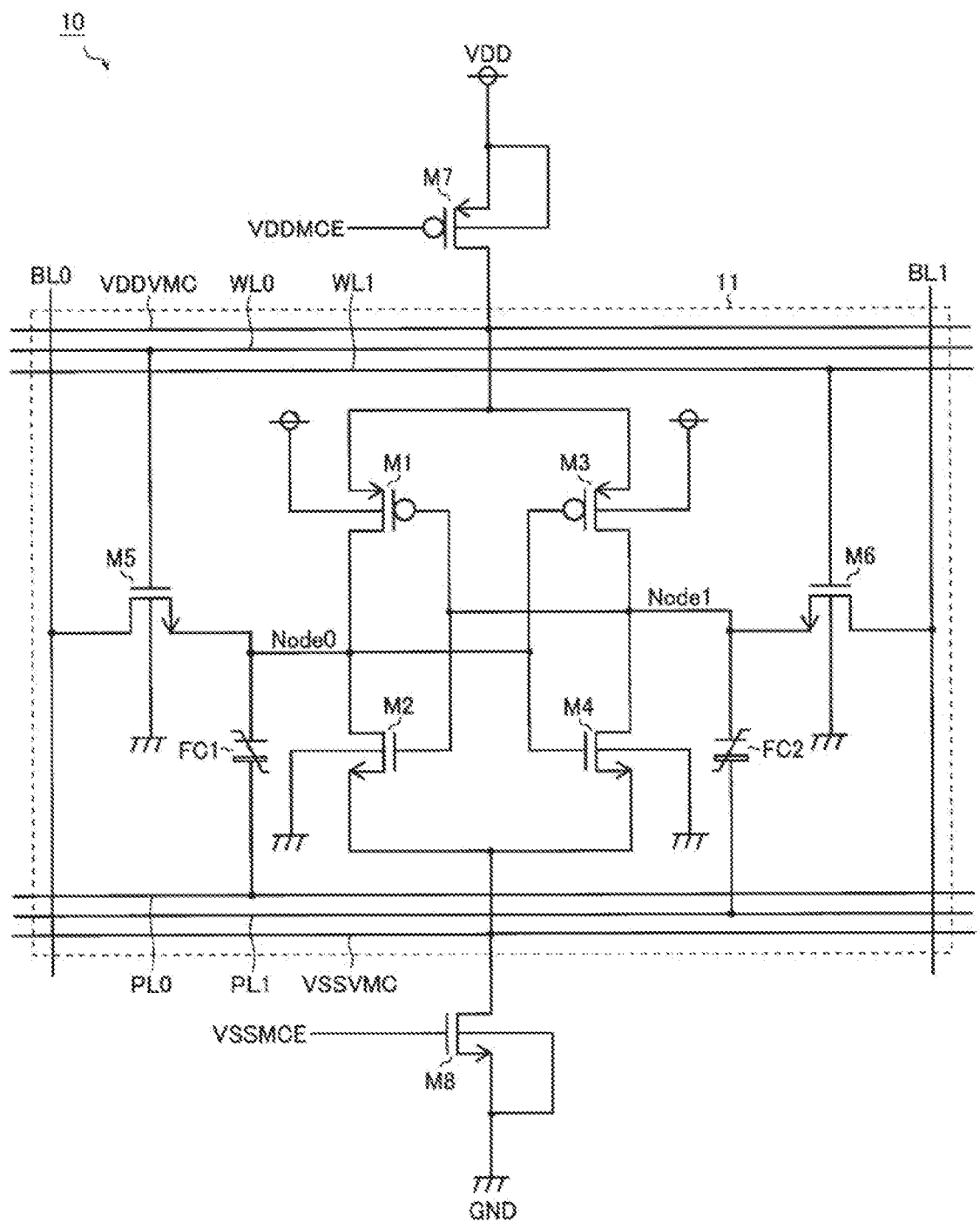
FIG. 7 is a circuit diagram of a memory cell according to a fourth embodiment of the present disclosure.

FIG. 7 is a circuit diagram of a memory cell 11 according to a fourth embodiment of the present disclosure. The memory cell 11 according to the present embodiment is based on the third embodiment (FIG. 6), but additionally includes an N-channel switching transistor M8 (NMOSFET) as a peripheral component. The switching transistor M8 will hereinafter be referred to as "transistor M8" for the sake of convenience. The transistor M8 has a source connected to ground. The transistor M8 has a drain connected to the sources of the transistors M2 and M4 through a local ground line VSSVMC. The local ground line VSSVMC is shared by a plurality of (e.g., eight) adjacent memory cells 11.

The transistor M8 has a gate connected to a terminal for applying an enable signal VSSMCE. Therefore, when the enable signal VCCMCE is of a high level, the transistor M8 is turned on, and when the enable signal VCCMCE is of a low level, the transistor M8 is turned off.

When the memory cell 11 is in recall operation, the plate lines PL0 and PL1 may be pulse-driven while the transistors M7 and M8 are turned off, thereby inducing voltages corresponding to the remanent polarization states of the respective ferroelectric capacitors FC1 and FC2 at the internal nodes Node0 and Node1. Thereafter, both the transistors M7 and M8 may be turned on to supply electric power to the inverter loop to secure the logic levels of the internal nodes Node0 and Node1.

In the third embodiment (FIG. 6), even when the transistor M7 is turned off to cut off the path for supplying electric power to the inverter loop, the sources of the respective transistors M2 and M4 remain connected to the ground terminal. Therefore, when the memory cell 11 is in recall operation, as the plate lines PL0 and PL1 are pulse-driven to increase the voltages at the internal nodes Node0 and Node1, the transistors M2 and M4 are turned on unintentionally, possibly failing to induce proper voltages at the internal nodes Node0 and Node1.

Especially if the plate lines PL0 and PL1 are separate from each other, the load capacitances of the internal nodes Node0 and Node1 are varied due to the pattern of data held by the memory cell 11, i.e., the remanent polarization states that the ferroelectric capacitors FC1 and FC2. Consequently, when the pulse-drive timing of the plate lines PL0 and PL1 are changed, the transistors M2 and M4 may be turned on in error, tending to cause data corruption, i.e., erroneous reading, in recall operation.

With the memory cell 11 according to the present embodiment, the sources of the respective transistors M2 and M4 can be disconnected from the ground terminal by turning off the transistor M7 and the transistor M8. Therefore, the above shortcoming does not happen, making it possible to eliminate data corruption, i.e., erroneous reading, in recall operation.

In FIG. 7, the memory cell 11 according to the present embodiment is based on the third embodiment (FIG. 6). However, the memory cell 11 according to the present embodiment may be based on the first embodiment (FIG. 4) or the second embodiment (FIG. 5), with the transistor M8 being incorporated therein.

Fifth Embodiment

Figure 8:
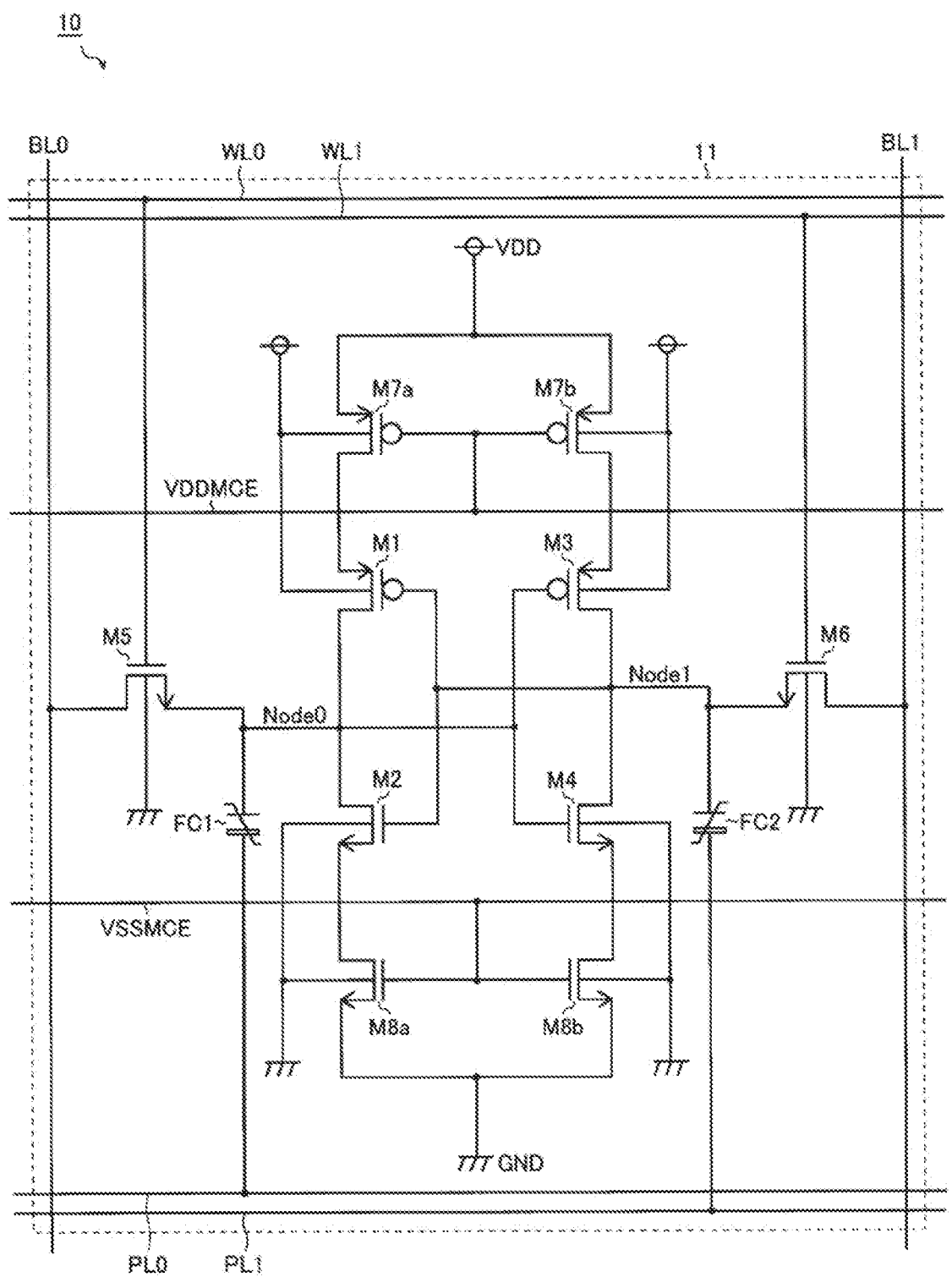
FIG. 8 is a circuit diagram of a memory cell according to a fifth embodiment of the present disclosure.

FIG. 8 is a circuit diagram of a memory cell 11 according to a fifth embodiment of the present disclosure. The memory cell 11 according to the present embodiment is based on the fourth embodiment (FIG. 7), and includes the transistors M7 and M8 as transistors M7a and M7b and transistors M8a and M8b, respectively, therein. This circuit change dispenses with the local power supply line VDDVMC and the local ground line VSSVMC.

Connections of the newly introduced components will be described below. The transistors M7a and M7b have respective sources connected to the power supply terminal. The transistor M7a has a drain connected to the source of the transistor M1. The transistor M7b has a drain connected to the source of the transistor M3. The transistors M7a and M7b have respective gates connected to a terminal for applying an enable signal VDDMCE.

The transistors M8a and M8b have respective sources connected to the ground terminal. The transistor M8a has a drain connected to the source of the transistor M2. The transistor M8b has a drain connected to the source of the transistor M4. The transistors M8a and M8b have respective gates connected to a terminal for applying an enable signal VDDMCE.

In other words, the memory cell 11 according to the present embodiment is of a 10T2C configuration that is a combination of ten transistors and two ferroelectric capacitors, including a pair of transistors M7a and M7b connected between the power supply terminal and the pair of transistors M1 and M3 and a pair of transistors M8a and M8b connected between the ground terminal and the pair of transistors M2 and M4.

In the above fourth embodiment (FIG. 7), even when the transistors M7 and M8 are turned off, the sources of the transistors M1 and M3 remain connected to the local power supply line VDDVMC, and the sources of the transistors M2 and M4 remain connected to the local ground lines VSSVMC. Therefore, electric charges are transferred from the internal nodes Node0 and Node1 to the respective parasitic capacitors of the local power supply line VDDVMC and the local ground line VSSVMC, tending to impair operational stability of the memory cell 11 and hence the semiconductor memory device 100.

With the memory cell 11 according to the present embodiment, a separate power supply is available for each memory cell 11 or each inverter, dispensing with the local power supply line VDDVMC and the local ground line VSSVMC. Unlike the above fourth embodiment (FIG. 7), when the transistors M7a and M7b and the transistors M8a and M8b are turned off, the internal nodes Node0 and Node1 are in a completely floating state, i.e., a potentially floating state. As a result, no electric charges are transferred from the internal nodes Node0 and Node1, thereby increasing operational stability of the memory cell 11 and hence the semiconductor memory device 100.

FIG. 8 illustrates an example in which the transistors M7a and M7b are controlled by the common enable signal VDDMCE and the transistors M8a and M8b are controlled by the common enable signal VSSMCE. However, these transistors may be controlled using individual enable signals at independent timings, respectively.

FIG. 8 illustrates an example that is based on the fourth embodiment (FIG. 7) and includes the transistors M7 and M8 that are outside of the memory cell 11 as transistors M7a and M7b and transistors M8a and M8b, respectively, therein. In accordance with similar principles, the present embodiment may cover an example that is based on the first embodiment (FIG. 4), the second embodiment (FIG. 5), or the third embodiment (FIG. 6) and includes the transistor M7 that is outside of the memory cell 11 as transistors M7a and M7b therein.

In FIG. 8, both the transistors M7 and M8 are included in the memory cell 11. However, either one of the transistors M7 and M8 may be included in the memory cell 11. Specifically, the transistor M7 and the transistors M8a and M8b may be used in combination, or the transistors M7a and M7b and the transistor M8 may be used in combination.

Sixth Embodiment

Figure 9:
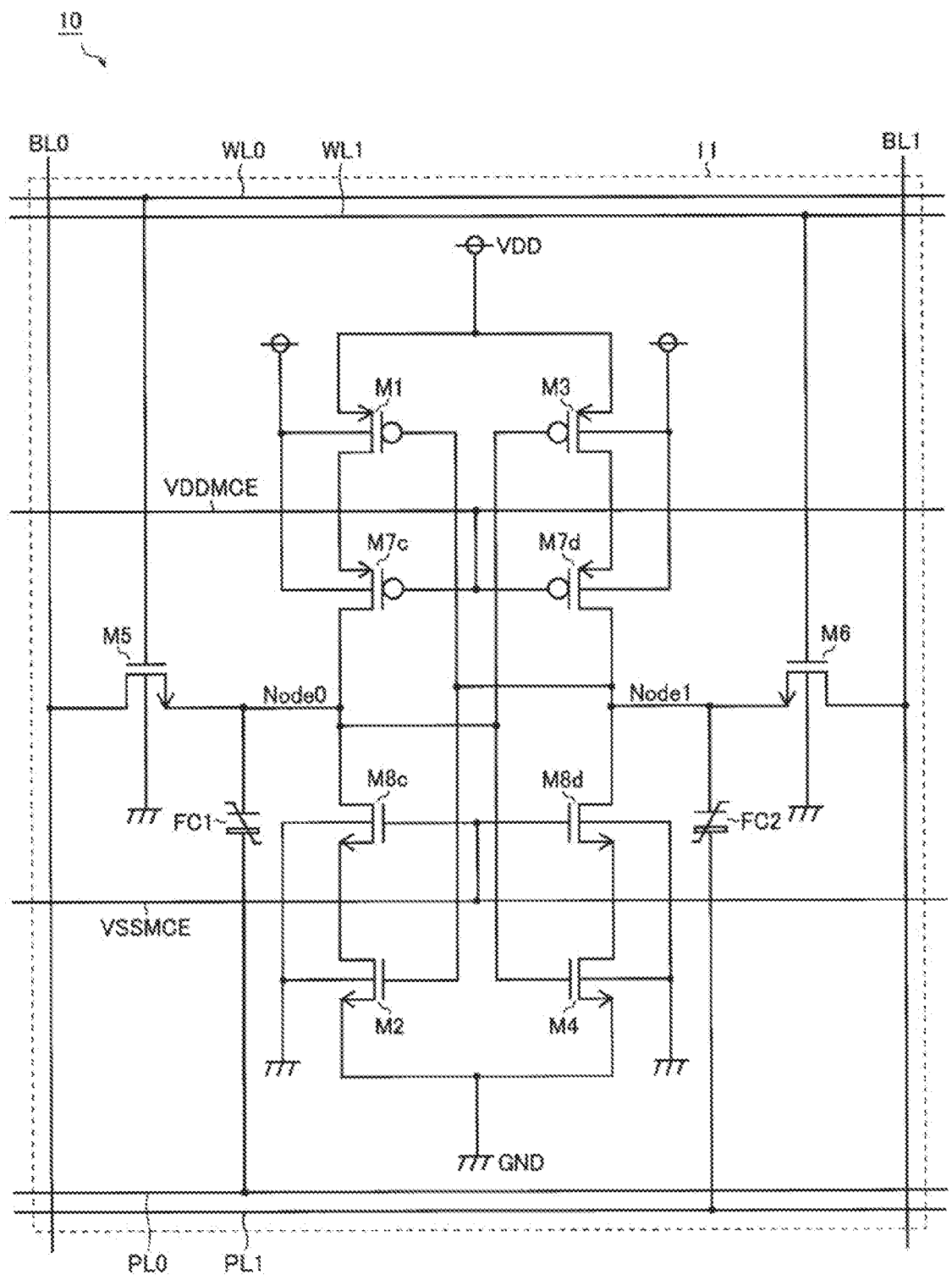
FIG. 9 is a circuit diagram of a memory cell according to a sixth embodiment of the present disclosure.

FIG. 9 is a circuit diagram of a memory cell 11 according to a sixth embodiment of the present disclosure. The memory cell 11 according to the present embodiment is based on the fifth embodiment (FIG. 8) and includes transistors M7c and M7d and transistors M8c and M8d instead of the transistors M7a and M7b and the transistors M8a and M8b.

Connections of the newly introduced components will be described below. The transistors M1 and M3 have respective sources connected to the power supply terminal. The transistor M1 has a drain connected to the source of the transistor M7c. The transistor M3 has a drain connected to the source of the transistor M7d. The transistors M7c and M7d have respective drains connected respectively to the internal nodes Node0 and Node1. The transistors M7c and M7d have respective gates connected to a terminal for applying an enable signal VDDMCE.

The transistors M2 and M4 have respective sources connected to the ground terminal. The transistor M2 has a drain connected to the source of the transistor M8c. The transistor M4 has a drain connected to the source of the transistor M8d. The transistors M8c and M8d have respective drains connected respectively to the internal nodes Node0 and Node1. The transistors M8c and M8d have respective gates connected to a terminal for applying an enable signal VSSMCE.

In other words, the memory cell 11 according to the present embodiment is of a 10T2C configuration including a pair of transistors M7c and M7d connected between the internal nodes Node0 and Node1 and the pair of transistors M1 and M3 and a pair of transistors M8c and M8d connected between the internal nodes Node0 and Node1 and the pair of transistors M2 and M4.

The fifth embodiment (FIG. 8) and the sixth embodiment (FIG. 9) are different from each other as follows: In the fifth embodiment (FIG. 8), the transistors M7a and M7b are connected between the sources of the respective transistors M1 and M3 and the terminal for applying the power supply voltage VDD, and the transistors M8a and M8b are connected between the sources of the respective transistors M2 and M4 and the terminal for applying the ground voltage GND. In the sixth embodiment (FIG. 9), the transistors M7c and M7d are connected between the drains of the respective transistors M1 and M3 and the internal nodes Node0 and Node1, and the transistors M8c and M8d are connected between the drains of the respective transistors M2 and M4 and the internal nodes Node0 and Node1.

This arrangement expects the memory cell 11 to improve a layout efficiency while at the same time offering the same operation and advantages as with the fifth embodiment (FIG. 8).

FIG. 9 illustrates an example in which the transistors M7c and M7d are controlled by the common enable signal VDDMCE and the transistors M8c and M8d are controlled by the common enable signal VSSMCE. However, these transistors may be controlled using individual enable signals at independent timings, respectively.

FIG. 9 illustrates an example that is based on the fifth embodiment (FIG. 8) and in which the transistors M7a and M7b are replaced with the transistors M7c and M7d and the transistors M8a and M8b are replaced with the transistors M8c and M8d. The present embodiment may cover an example that is based on the first embodiment (FIG. 4), the second embodiment (FIG. 5), or the third embodiment (FIG. 6) and includes the transistor M7 that is outside of the memory cell 11 as transistors M7c and M7d therein. Moreover, present embodiment may cover an example that is based on the fourth embodiment (FIG. 7) and includes the transistors M7 and M8 that are outside of the memory cell 11 as transistors M7c and M7d and transistors M8c and M8d, respectively, therein, which is accordingly of the same arrangement as with the present embodiment that is based on the fifth embodiment (FIG. 8).

In FIG. 9, both the transistors M7 and M8 are included in the memory cell 11. However, either one of the transistors M7 and M8 may be included in the memory cell 11. Specifically, the transistor M7 and the transistors M8c and M8d may be used in combination, or the transistors M7c and M7d and the transistor M8 may be used in combination.

In FIG. 9, the transistors M7c and M7d are connected between the drains of the respective transistors M1 and M3 and the internal nodes Node0 and Node1, and the transistors M8c and M8d are connected between the drains of the respective transistors M2 and M4 and the internal nodes Node0 and Node1. However, the transistors M7a and M7b and the transistors M8c and M8d may be used in combination, or the transistors M7c and M7d and the transistors M8a and M8b may be used in combination. It is also possible to employ a diagonally combined configuration, i.e., a combination of the transistors M7 and M7d, a combination of the transistors M7c and M7b, a combination of the transistors M8a and M8d, or a combination of the transistors M8c and M8b.

Seventh Embodiment

Figure 10:
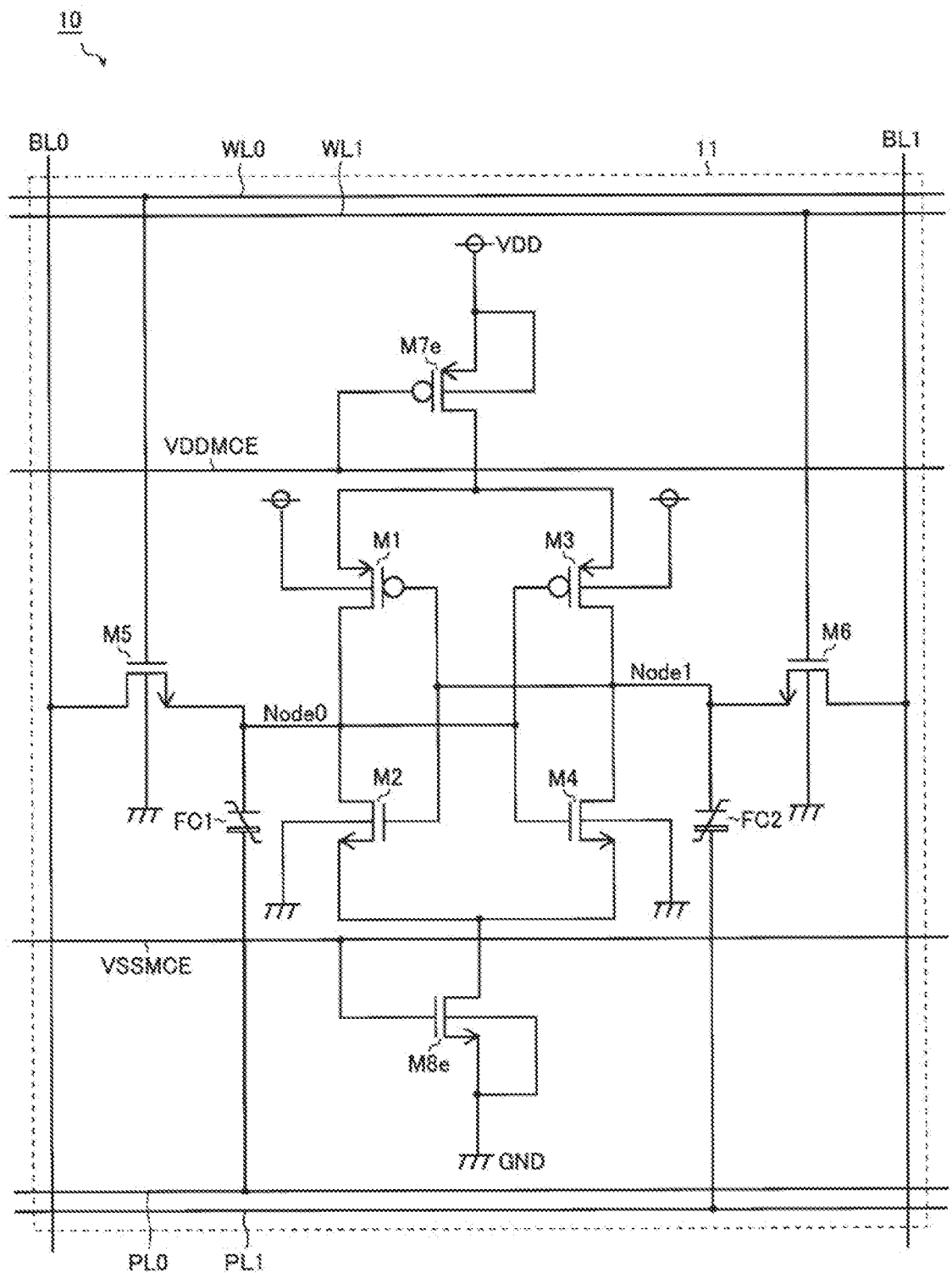
FIG. 10 is a circuit diagram of a memory cell according to a seventh embodiment of the present disclosure.

FIG. 10 is a circuit diagram of a memory cell 11 according to a seventh embodiment of the present disclosure. The memory cell 11 according to the present embodiment is based on the fifth embodiment (FIG. 8), but incorporates transistors M7e, M8e, instead of the transistors M7a and M7b and the transistors M8a and M8b, therein.

Connections of the newly introduced components will be described below. The transistor M7e has a drain connected to the sources of the respective transistors M1 and M3. The transistor M7e has a gate connected to a terminal for applying an enable signal VDDMCE.

The transistor M8e has a source connected to the ground terminal. The transistor M8e has a drain connected to the sources of the respective transistors M2 and M4. The transistor M8e has a gate connected to a terminal for applying an enable signal VSSMCE.

In other words, the memory cell 11 according to the present embodiment is of an 8T2C configuration that is a combination of eight transistors and two ferroelectric capacitors, including a single transistor M7e connected in common between the power supply terminal and the pair of transistors M1 and M3 and a single transistor M8e connected in common between the ground terminal and the pair of transistors M2 and M4.

With this arrangement, when both the transistors M7e, M8e are turned off, the internal nodes Node0 and Node1 are brought into a substantially floating state, i.e., a state in which electric charges between the nodes in the inverter loop are accepted. Therefore, while minimizing the transfer of electric charges from the internal nodes Node0 and Node1 for stabler operation, the number of components is reduced from that of the above fifth embodiment (FIG. 8) to make the memory cell 11 smaller in footprint.

FIG. 10 illustrates an example that is based on the fifth embodiment (FIG. 8) and in which the transistors M7a and M7b are replaced with the transistor M7e and the transistors M8a and M8b are replaced with the transistor M8e. The present embodiment may cover an example that is based on the first embodiment (FIG. 4), the second embodiment (FIG. 5), the third embodiment (FIG. 6), or the fourth embodiment (FIG. 7) and includes the transistor M7 that is outside of the memory cell 11 as a transistor M7e therein. Moreover, present embodiment may cover an example that is based on the fourth embodiment (FIG. 7) and includes the transistors M7 and M8 that are outside of the memory cell 11 as transistors M7e, M8e, respectively, therein, which is accordingly of the same arrangement as with the present embodiment that is based on the fifth embodiment (FIG. 8).

In FIG. 10, both the transistors M7 and M8 are included in the memory cell 11. However, either one of the transistors M7 and M8 may be included in the memory cell 11. Specifically, the transistor M7 and the transistor M8e may be used in combination, or the transistor M7e and the transistor M8 may be used in combination.

In FIG. 10, the transistors M7a and M7b are integrated as the transistor M7e, and the transistors M8a and M8b are integrated as the transistor M8e. However, either the transistors M7a and M7b or the transistors M8a and M8b may be integrated. Specifically, the transistors M7a and M7b or the transistors M7c and M7d and the transistor M8e may be used in combination. Alternatively, the transistor M7e and the transistors M8a and M8b or the transistors M8c and M8d may be used in combination. It is also free to apply a diagonally combined configuration as described above, i.e., a combination of the transistors M7 and M7d and the transistors M8e, a combination of the transistors M7c and M7b and the transistor M8e, a combination of the transistor M7e and the transistors M8a and M8d, or a combination of the transistor M7e and the transistors M8c and M8b.

Eighth Embodiment

Figure 11:
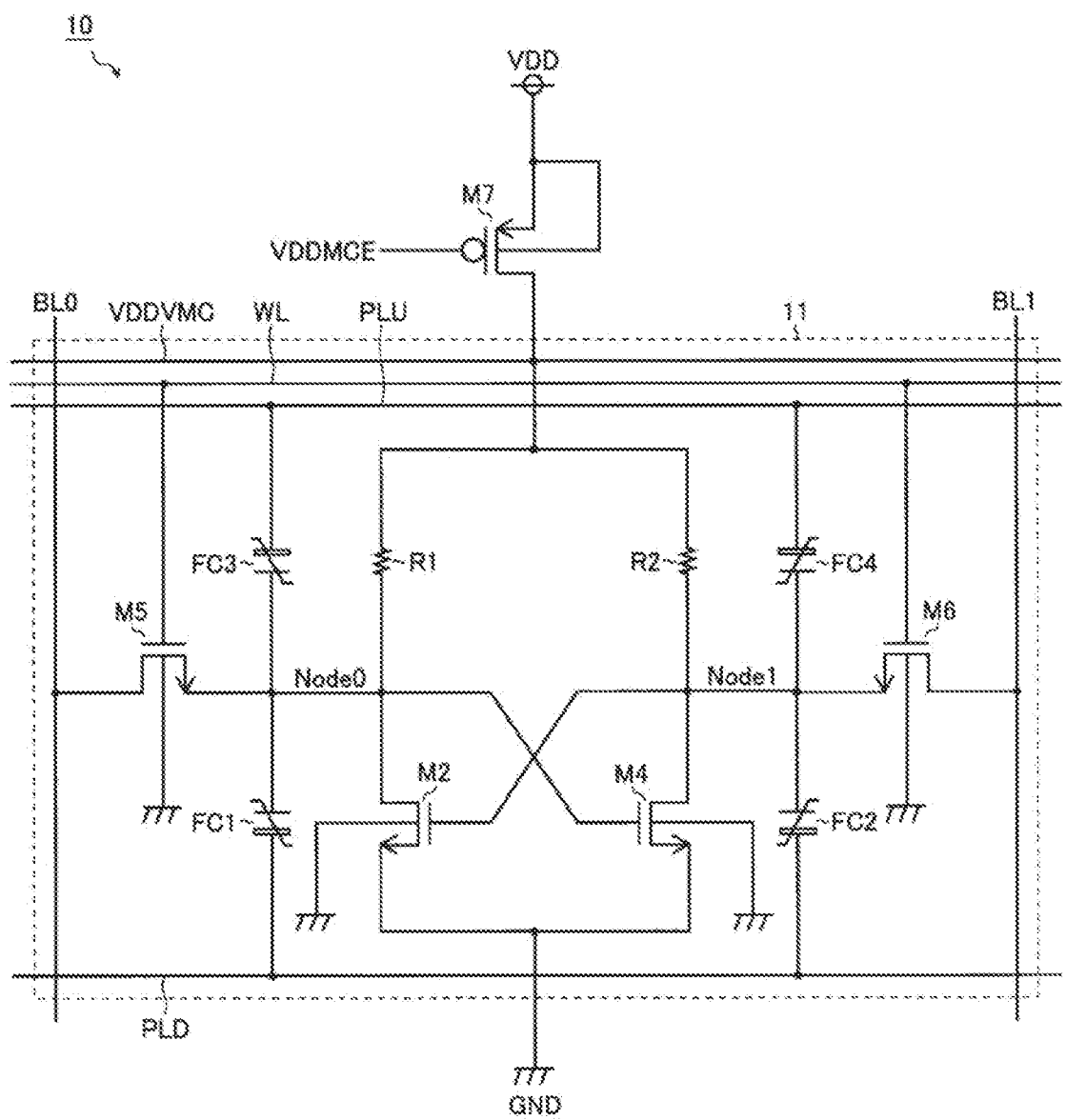
FIG. 11 is a circuit diagram of a memory cell according to an eighth embodiment of the present disclosure.

FIG. 11 is a circuit diagram of a memory cell 11 according to an eighth embodiment of the present disclosure. The memory cell 11 according to the present embodiment is based on the first embodiment (FIG. 4), but employs load resistors R1 and R2 instead of the transistors M1 and M3. In other words, the memory cell 11 according to the present embodiment is a ferroelectric shadow memory having a 4T2R4C configuration which is a combination of an SRAM having a 4T2R configuration including four transistors and two resistors, and four ferroelectric capacitors. The memory cell 11 according to the eighth embodiment will subsequently be referred to as a comparative example to be compared with memory cells according to ninth through fifteenth embodiments to be described later. Those parts of the memory cell 11 illustrated in FIG. 11 which are identical to those of the memory cell 11 illustrated in FIG. 4 are denoted by identical reference characters, and will not be described in detail below.

The load resistors R1 and R2 have respective first ends connected to the drain of the transistor M7 and respective second ends connected respectively to the internal nodes Node0 and Node1.

The memory cell 11 according to the present embodiment remains to be improved in terms of operational stability and testability. Since the memory cell 11 according to the present embodiment may require the four ferroelectric capacitors FC1 through FC4 as with the first embodiment (FIG. 4), it tends to suffer disadvantages in terms of making itself smaller in size, higher in speed, and lower in electric power consumption.

Ninth Embodiment

FIG. 12 is a circuit diagram of a memory cell 11 according to a ninth embodiment of the present disclosure. The memory cell 11 according to the present embodiment is based on the eighth embodiment (FIG. 11), but has the number of ferroelectric capacitors reduced from 4 to 2 pursuant to the second embodiment (FIG. 5). Therefore, the memory cell 11 according to the present embodiment can be made smaller in size, higher in speed, and lower in electric power consumption, i.e., smaller in instantaneous current, compared with the eighth embodiment.

When the memory cell 11 according to the present embodiment is in recall operation, it is desirable that the plate line PL be pulse-driven while the transistors M5 and M6 are turned on, as with the second embodiment (FIG. 5). In such recall operation, the respective capacitive components of the bit lines BL0 and BL1 can be used as the load capacitances. Accordingly, data corruption, i.e., erroneous reading, is unlikely to occur in recall operation.

Tenth Embodiment

Figure 13:
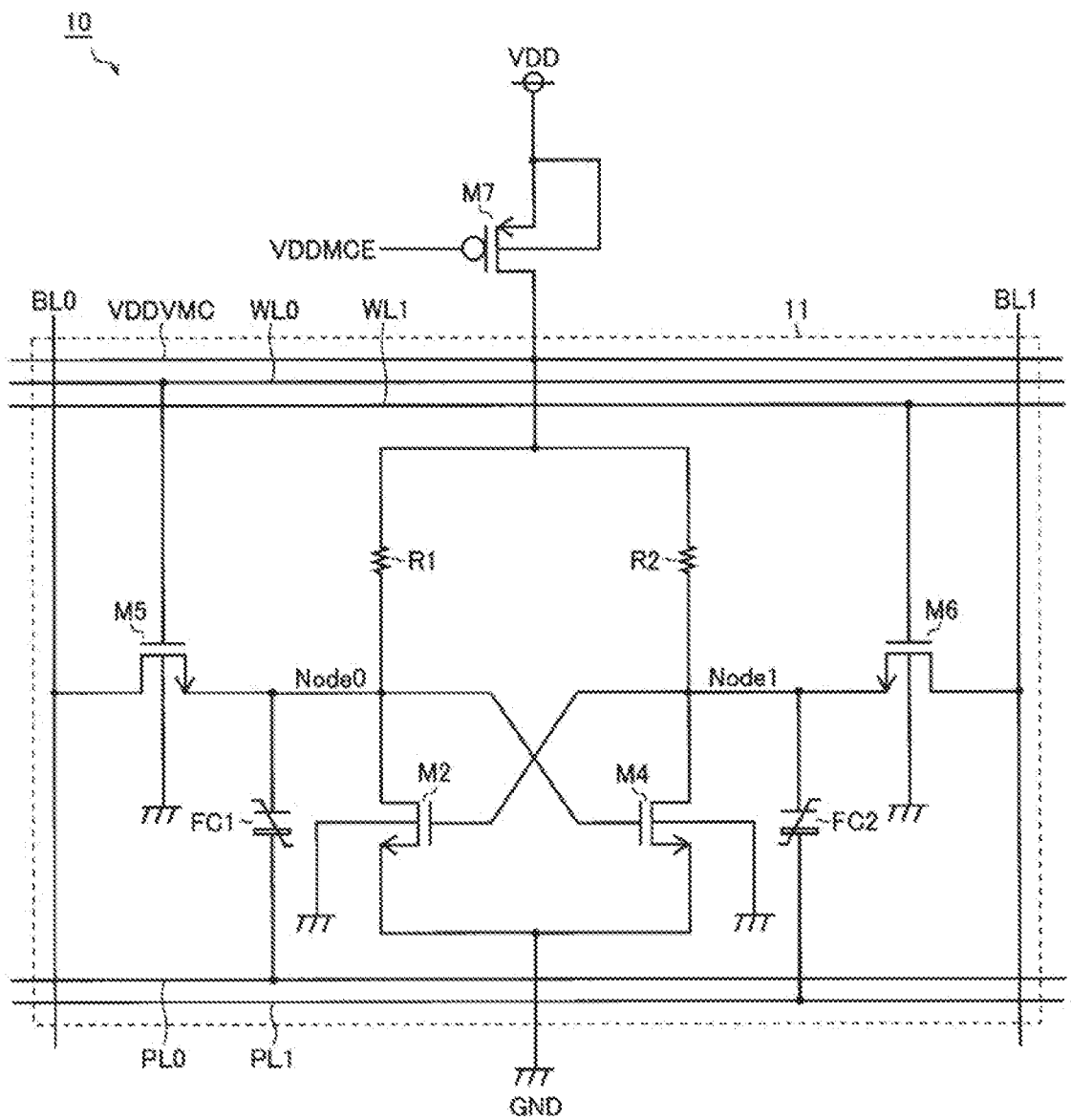
FIG. 13 is a circuit diagram of a memory cell according to a tenth embodiment of the present disclosure.

FIG. 13 is a circuit diagram of a memory cell 11 according to a tenth embodiment of the present disclosure. The memory cell 11 according to the present embodiment is based on the ninth embodiment (FIG. 12), but has the word line WL and the plate line PL separated into word lines and plate lines associated with left and right sections of the memory cell (WL→WL0/WL1, PL→PL0/PL1).

As the word line WL and the plate line PL are separated into word lines and plate lines that are independent in the left and right sections of the memory cell, the ferroelectric capacitors FC1 and FC2 can independently be controlled or accessed, making it possible to achieve increased testability, i.e., design for testability (DFT) compatibility, of the memory cell 11.

In FIG. 12, the memory cell 11 according to the present embodiment is based on the ninth embodiment (FIG. 12). However, the memory cell 11 according to the present embodiment may be based on the eighth embodiment (FIG. 11), but the word line WL and the plate lines PLU and PLD may be separated into word lines and plate lines that are separated in the left and right sections of the memory cell 11 for increasing the testability thereof (WL→WL0/WL1, PLU→PLU0/PLU1, PLD→PLD0/PLD1).

Eleventh Embodiment

Figure 14:
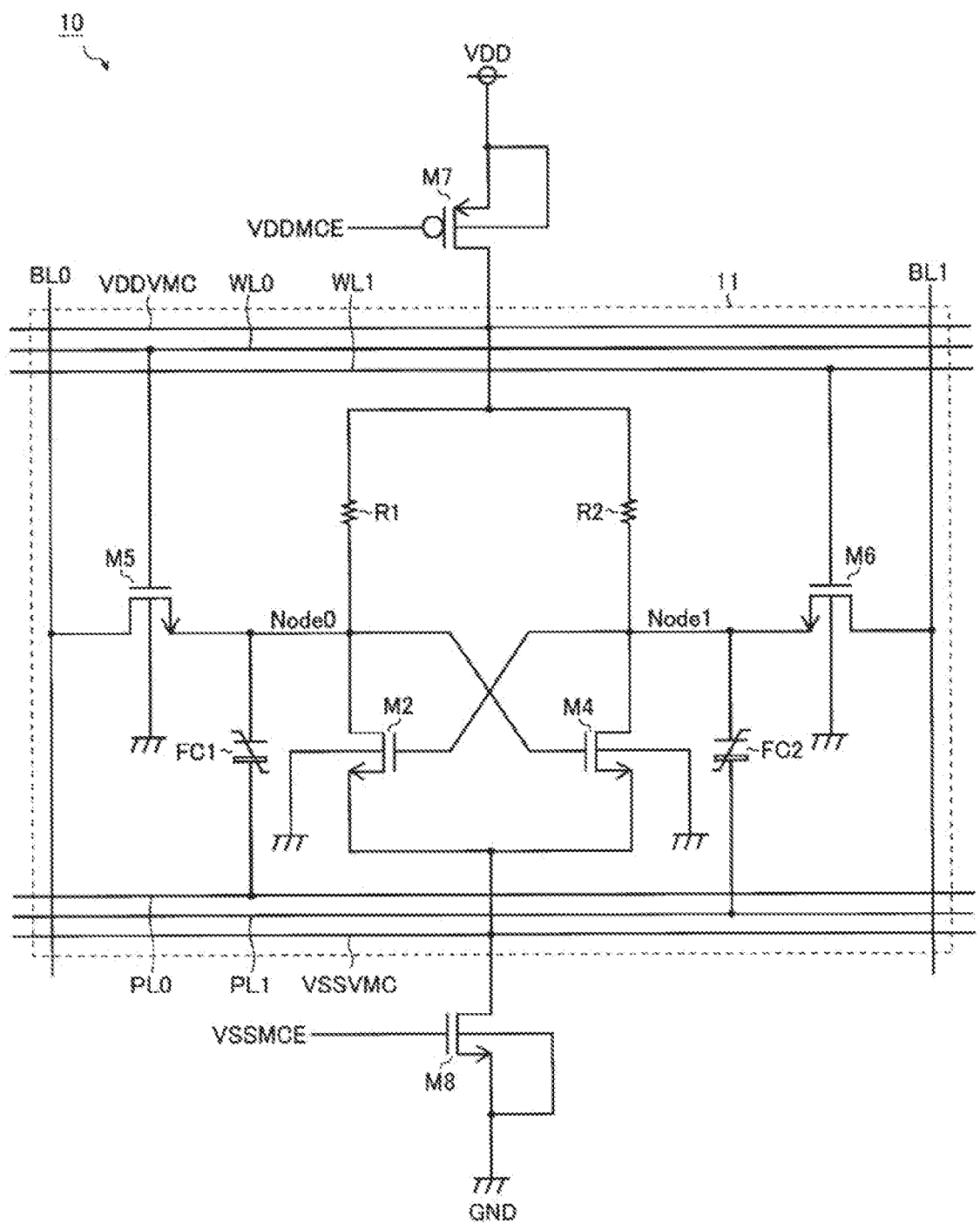
FIG. 14 is a circuit diagram of a memory cell according to an eleventh embodiment of the present disclosure.

FIG. 14 is a circuit diagram of a memory cell 11 according to an eleventh embodiment of the present disclosure. The memory cell 11 according to the present embodiment is based on the tenth embodiment (FIG. 13), but additionally includes an N-channel switching transistor M8 as a peripheral component pursuant to the fourth embodiment (FIG. 7).

With the memory cell 11 according to the present embodiment, the sources of the respective transistors M2 and M4 can be disconnected from the ground terminal by turning off the transistor M7 and the transistor M8. Therefore, it is possible to eliminate data corruption, i.e., erroneous reading, in recall operation.

In FIG. 14, the memory cell 11 according to the present embodiment is based on the tenth embodiment (FIG. 13). However, the memory cell 11 according to the present embodiment may be based on the eighth embodiment (FIG. 11) or the ninth embodiment (FIG. 12), with the transistor M8 being incorporated therein.

Twelfth Embodiment

Figure 15:
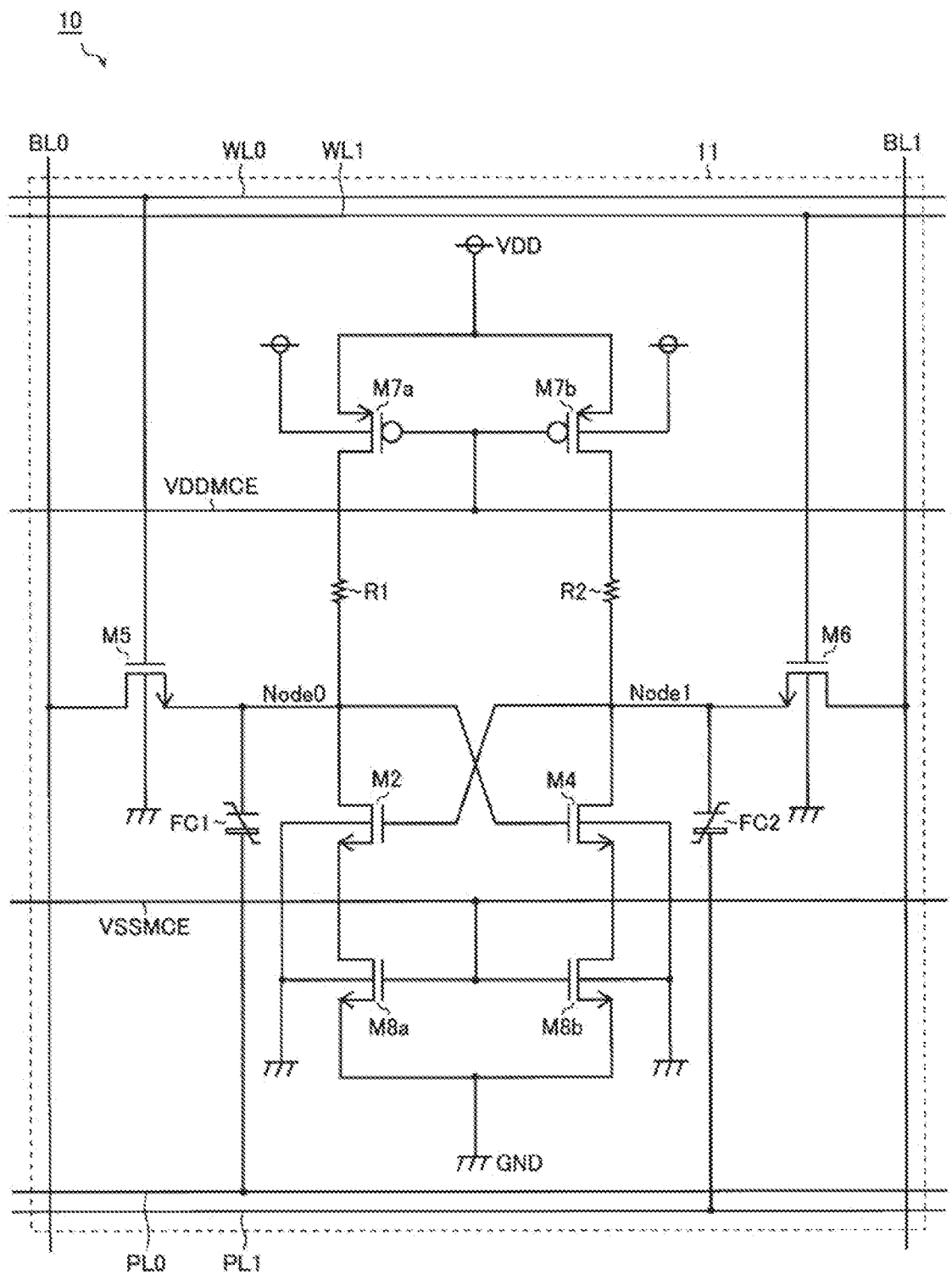
FIG. 15 is a circuit diagram of a memory cell according to a twelfth embodiment of the present disclosure.

FIG. 15 is a circuit diagram of a memory cell according to a twelfth embodiment of the present disclosure. The memory cell 11 according to the present embodiment is based on the eleventh embodiment (FIG. 14), and includes the transistors M7 and M8 as transistors M7a and M7b and transistors M8a and M8b, respectively, therein. This circuit change dispenses with the local power supply line VDDVMC and the local ground line VSSVMC.

Specifically, the memory cell 11 according to the present embodiment is of an 8T2R2C configuration which is a combination of eight transistors, two resistors, and two ferroelectric capacitors, including a pair of transistors M7a and M7b connected between the power supply terminal and the pair of load resistances R1 and R2 and a pair of transistors M8a and M8b connected between the ground terminal and the pair of transistors M2 and M4.

With the memory cell 11 according to the present embodiment, a separate power supply is available for each memory cell 11 or each inverter, dispensing with the local power supply line VDDVMC and the local ground line VSSVMC. Consequently, no electric charges are transferred from the internal nodes Node0 and Node1, thereby increasing operational stability of the memory cell 11 and hence the semiconductor memory device 100.

FIG. 15 illustrates an example in which the transistors M7a and M7b are controlled by the common enable signal VDDMCE and the transistors M8a and M8b are controlled by the common enable signal VSSMCE. However, these transistors may be controlled using individual enable signals at independent timings, respectively.

FIG. 15 illustrates an example that is based on the eleventh embodiment (FIG. 14) and includes the transistors M7 and M8 that are outside of the memory cell 11 as transistors M7a and M7b and transistors M8a and M8b, respectively, therein. In accordance with similar principles, the present embodiment may cover an example that is based on the eighth embodiment (FIG. 11), the ninth embodiment (FIG. 12), or the tenth embodiment (FIG. 13) and includes the transistor M7 that is outside of the memory cell 11 as transistors M7a and M7b therein.

In FIG. 15, both the transistors M7 and M8 are included in the memory cell 11. However, either one of the transistors M7 and M8 may be included in the memory cell 11. Specifically, the transistor M7 and the transistors M8a and M8b may be used in combination, or the transistors M7a and M7b and the transistor M8 may be used in combination.

Thirteenth Embodiment

Figure 16:
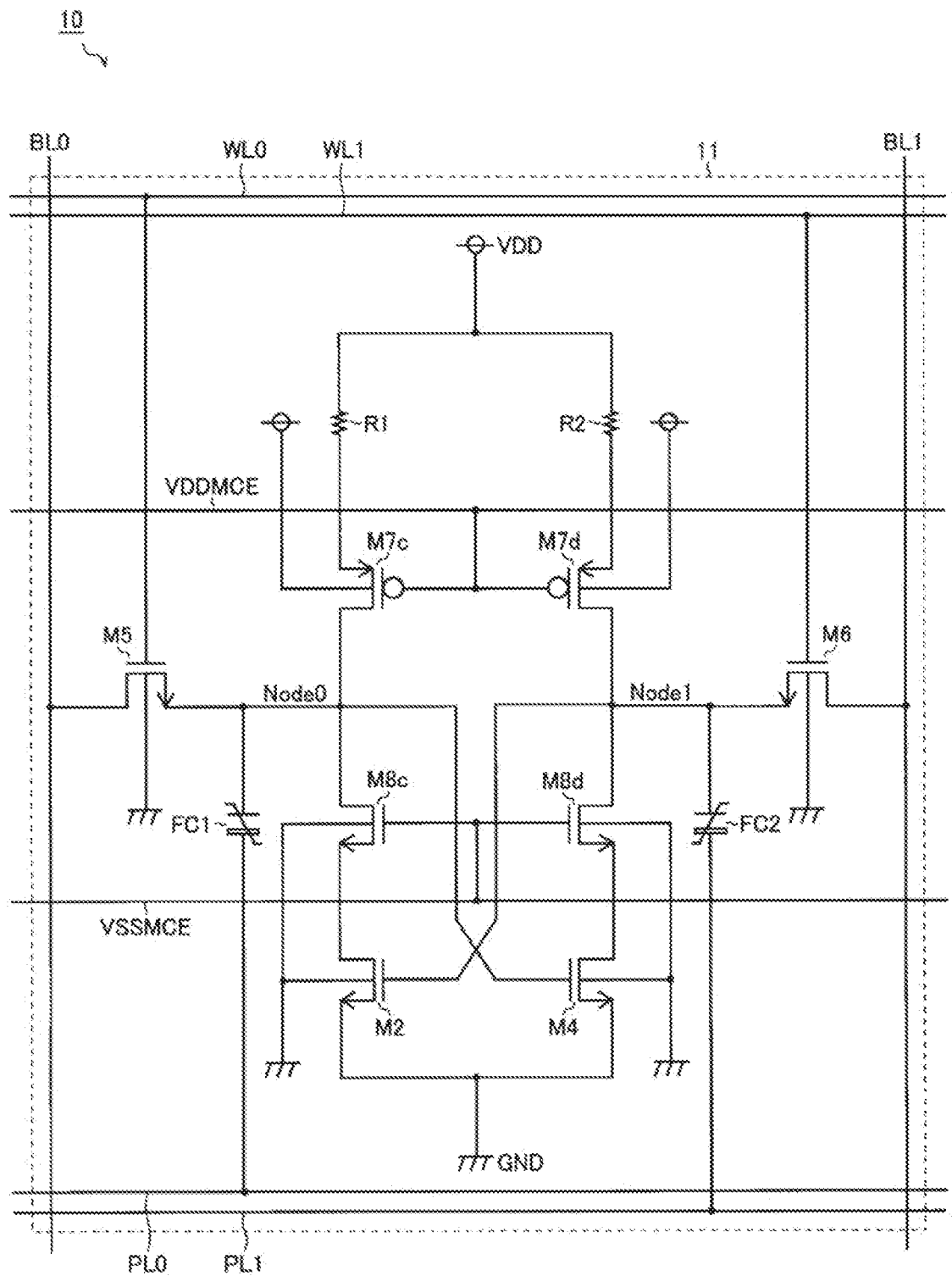
FIG. 16 is a circuit diagram of a memory cell according to a thirteenth embodiment of the present disclosure.

FIG. 16 is a circuit diagram of a memory cell 11 according to a thirteenth embodiment of the present disclosure. The memory cell 11 according to the present embodiment is based on the twelfth embodiment (FIG. 15), but incorporates transistors M7c and M7d and transistors M8c and M8d therein instead of the transistors M7a and M7b and the transistors M8a and M8b pursuant to the above sixth embodiment (FIG. 9).

In other words, the memory cell 11 according to the present embodiment is of an 8T2R2C configuration including a pair of transistors M7c and M7d connected between the internal nodes Node0 and Node1 and the pair of load resistances R1 and R2 and a pair of transistors M8c and M8d connected between the internal nodes Node0 and Node1 and the pair of transistors M2 and M4.

This arrangement expects the memory cell 11 to improve a layout efficiency while at the same time offering the same operation and advantages as with the twelfth embodiment (FIG. 15).

FIG. 16 illustrates an example that is based on the twelfth embodiment (FIG. 15) and in which the transistors M7a and M7b are replaced with the transistors M7c and M7d and the transistors M8a and M8b are replaced with the transistors M8c and M8d. The present embodiment may cover an example that is based on the eighth embodiment (FIG. 11), the ninth embodiment (FIG. 12), or the tenth embodiment (FIG. 13) and includes the transistor M7 that is outside of the memory cell 11 as transistors M7c and M7d therein. Moreover, present embodiment may cover an example that is based on the eleventh embodiment (FIG. 14) and includes the transistors M7 and M8 that are outside of the memory cell 11 as transistors M7c and M7d and transistors M8c and M8d, respectively, therein, which is accordingly of the same arrangement as with the present embodiment that is based on the twelfth embodiment (FIG. 15).

In FIG. 16, both the transistors M7 and M8 are included in the memory cell 11. However, either one of the transistors M7 and M8 may be included in the memory cell 11. Specifically, the transistor M7 and the transistors M8c and M8d may be used in combination, or the transistors M7c and M7d and the transistor M8 may be used in combination.

In FIG. 16, the transistors M7c and M7d are connected between the load resistors R1 and R2 and the internal nodes Node0 and Node1, and the transistors M8c and M8d are connected between the drains of the respective transistors M2 and M4 and the internal nodes Node0 and Node1. However, the transistors M7a and M7b and the transistors M8c and M8d may be used in combination, or the transistors M7c and M7d and the transistors M8a and M8b may be used in combination. It is also possible to employ a diagonally combined configuration, i.e., a combination of the transistors M7 and M7d, a combination of the transistors M7c and M7b, a combination of the transistors M8a and M8d, or a combination of the transistors M8c and M8b.

Fourteenth Embodiment

Figure 17:
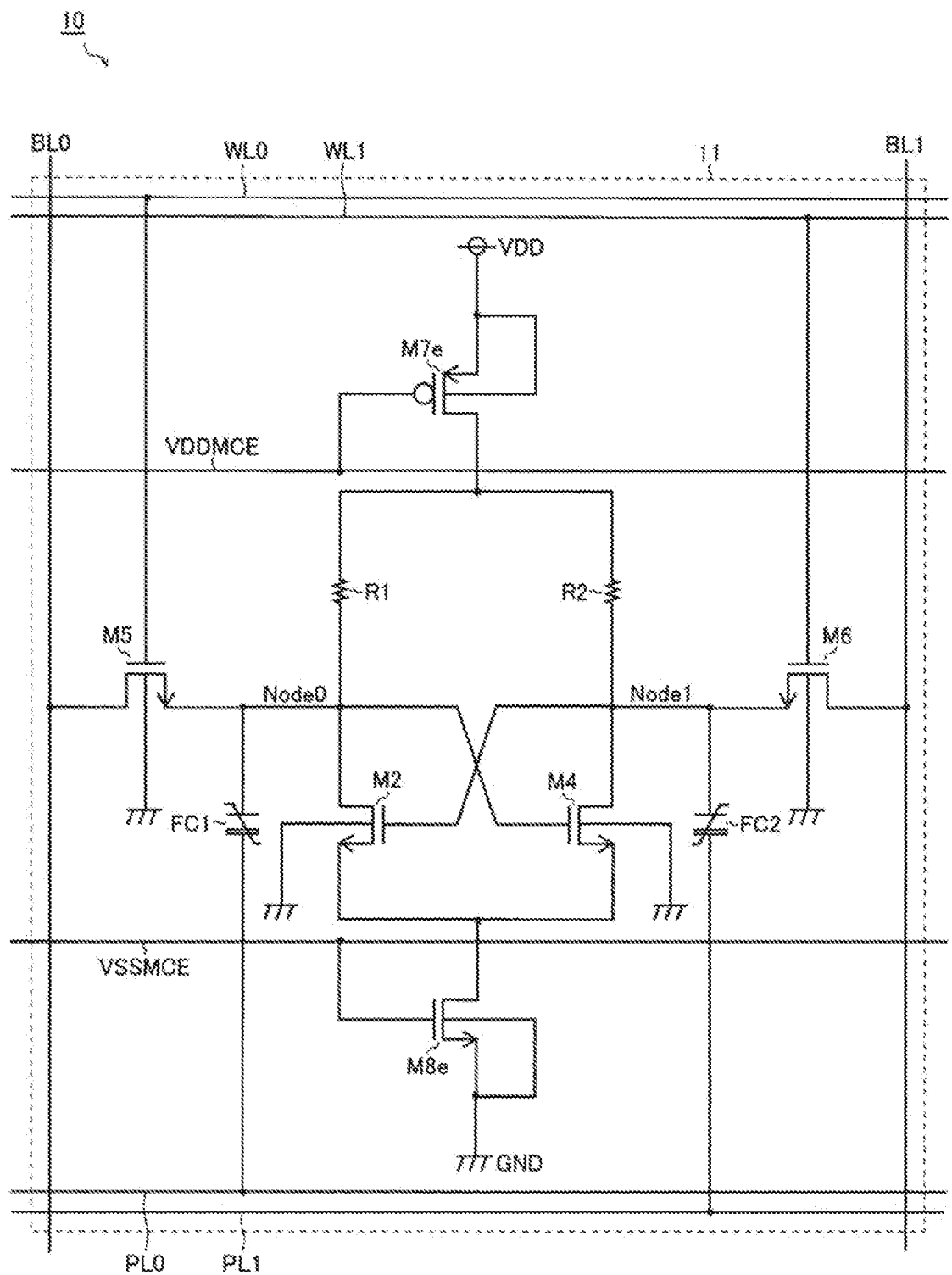
FIG. 17 is a circuit diagram of a memory cell according to a fourteenth embodiment of the present disclosure.

FIG. 17 is a circuit diagram of a memory cell 11 according to a fourteenth embodiment of the present disclosure. The memory cell 11 according to the present embodiment is based on the twelfth embodiment (FIG. 15), but incorporates transistors M7e, M8e therein instead of the transistors M7a and M7b and the transistors M8a and M8b pursuant to the seventh embodiment (FIG. 10).

In other words, the memory cell 11 according to the present embodiment is of a 6T2R2C configuration that is a combination of six transistors, two resistors, and two ferroelectric capacitors, including a single transistor M7e connected in common between the power supply terminal and the pair of load resistances R1 and R2 and a single transistor M8e connected in common between the ground terminal and the pair of transistors M2 and M4.

With this arrangement, while minimizing the transfer of electric charges from the internal nodes Node0 and Node1 for stabler operation, the number of components is reduced from that of the above twelfth embodiment (FIG. 15) to make the memory cell 11 smaller in footprint.

FIG. 17 illustrates an example that is based on the twelfth embodiment (FIG. 15) and in which the transistors M7a and M7b are replaced with the transistors M7d, M7d and the transistors M8a and M8b are replaced with the transistors M8c and M8d. The present embodiment may cover an example that is based on the eighth embodiment (FIG. 11), the ninth embodiment (FIG. 12), the tenth embodiment (FIG. 13) and includes the transistor M7 that is outside of the memory cell 11 as transistors M7c and M7d therein. Moreover, present embodiment may cover an example that is based on the eleventh embodiment (FIG. 14) and includes the transistors M7 and M8 that are outside of the memory cell 11 as transistors M7c and M7d and transistors M8c and M8d, respectively, therein, which is accordingly of the same arrangement as with the present embodiment that is based on the twelfth embodiment (FIG. 15).

In FIG. 17, both the transistors M7 and M8 are included in the memory cell 11. However, either one of the transistors M7 and M8 may be included in the memory cell 11. Specifically, the transistor M7 and the transistor M8e may be used in combination, or the transistor M7e and the transistor M8 may be used in combination.

In FIG. 17, the transistors M7a and M7b are integrated as the transistor M7e, and the transistors M8a and M8b are integrated as the transistor M8e. However, either the transistors M7a and M7b or the transistors M8a and M8b may be integrated. Specifically, the transistors M7a and M7b or the transistors M7c and M7d and the transistor M8e may be used in combination. Alternatively, the transistor M7e and the transistors M8a and M8b or the transistors M8c and M8d may be used in combination. It is also free to apply a diagonally combined configuration as described above, i.e., a combination of the transistors M7 and M7d and the transistors M8e, a combination of the transistors M7c and M7b and the transistor M8e, a combination of the transistor M7e and the transistors M8a and M8d, or a combination of the transistor M7e and the transistors M8c and M8b.

Fifteenth Embodiment

Figure 18:
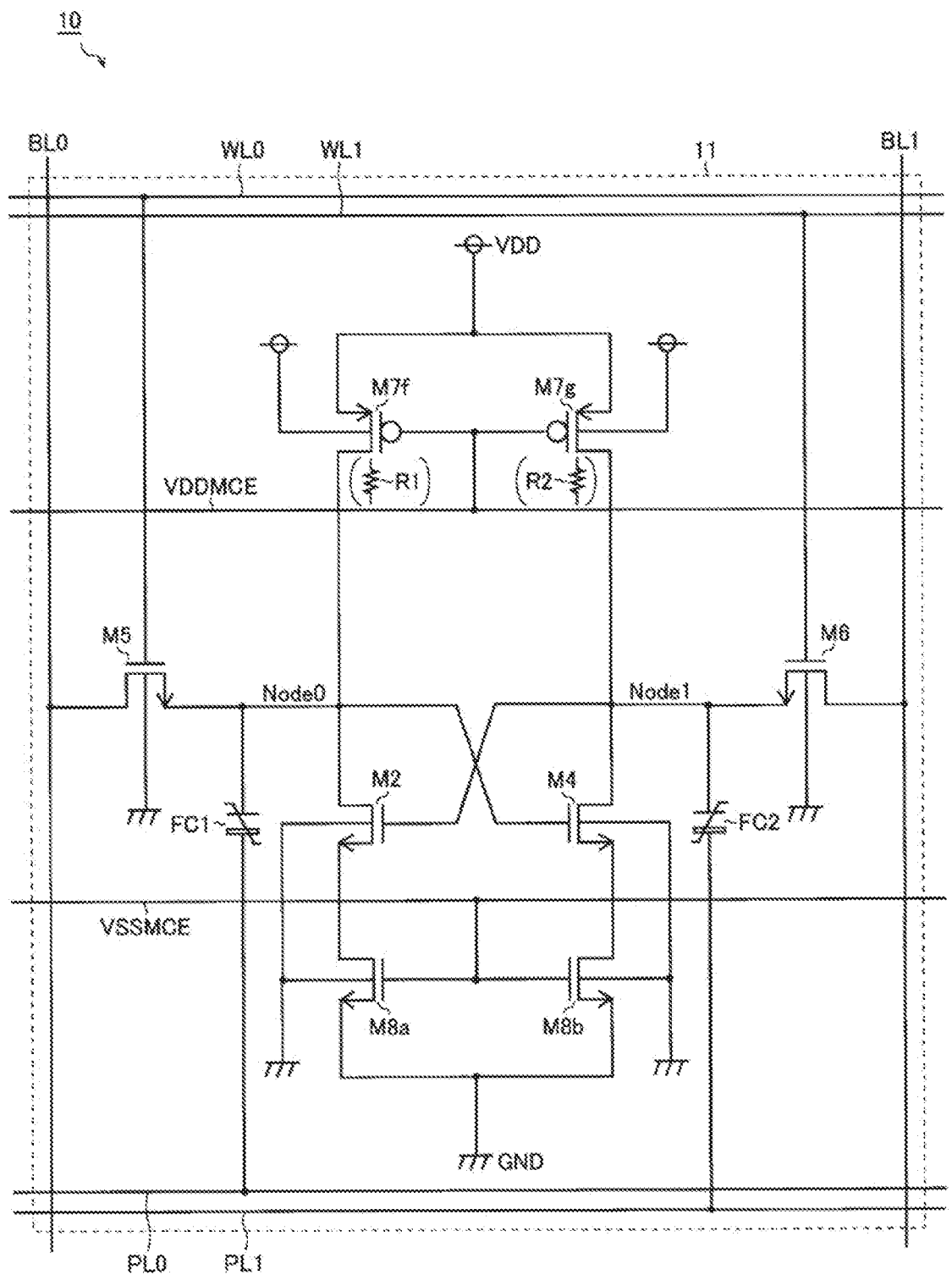
FIG. 18 is a circuit diagram of a memory cell according to a fifteenth embodiment of the present disclosure.

FIG. 18 is a circuit diagram of a memory cell 11 according to a fifteenth embodiment of the present disclosure. The memory cell 11 according to the present embodiment is based on the twelfth embodiment (FIG. 15), but has the load resistors R1 and R2 dispensed with and incorporates transistors M7f and M7g therein instead of the transistors M7a and M7b.

Connections of the newly introduced components will be described below. The transistors M7f and M7g have respective sources connected to the power supply terminal. The transistors M7f and M7g have respective drains connected respectively to the internal nodes Node0 and Node1. The transistors M7f and M7g have respective gates connected to a terminal for applying an enable signal VDDMCE.

When the transistors M7f and M7g are turned on, they function as load resistors R1 and R2. The function may be accomplished by setting the low level of the enable signal VDDMCE to a voltage value at which the transistors M7f and M7g are not fully turned on, or designing the components such that the respective on resistance values of the transistors M7f and M7g are equal to the resistance values of the load resistors R1 and R2.

In other words, the memory cell 11 according to the present embodiment is of a 6T2R2C configuration including a pair of transistors M7f and M7g connected between the internal nodes Node0 and Node1 and the power supply terminal, and functioning as the load resistors R1 and R2 when turned on, and a pair of transistors M8a and M8b connected between the ground terminal and the pair of transistors M2 and M4.

With this arrangement, while offering the same operation and advantages as with the twelfth embodiment (FIG. 15), the number of components is reduced from that of the twelfth embodiment to make the memory cell 11 smaller in footprint.

In FIG. 18, the memory cell 11 according to the present embodiment is based on the twelfth embodiment (FIG. 15). However, the memory cell 11 according to the present embodiment may be based on the thirteenth embodiment (FIG. 16), but may have the load resistors R1 and R2 dispensed with and incorporate transistors M7f and M7g therein instead of the transistors M7c and M7d. Moreover, the transistors M7f and M7g and the transistors M8 or M8e may be combined with each other.

<Applications to Internet of Things (IoT)>

General sensor nodes consume much of electric power for communication. For extending the availability time of sensor nodes, it is effective to reduce the rate of communication, i.e., the amount of data. For example, the introduction of edge computing for selecting data and compressing and expanding data at terminals has been proposed. According to such edge computing, it is desirable to shut down the power supply for reducing electric power consumption immediately after the data processing is finished efficiently, i.e., at high speeds. Memories that are non-volatile like read-only memory (ROM) and accessible like random access memory (RAM) are effective for such processes.

For measuring biological signals of humans, for example, data are acquired at a rate of approximately 1024 times per second. Therefore, it may be necessary to turn on power, recover data, process data, save data, and turn off power within approximately one millisecond. To meet such a requirement, a memory which is non-volatile needs to have data rewritten at rate on the order of µs, and may require a rewriting durability of approximately 88.5×106 times a day and a power saving capability.

At present, there is not available on the market any memory, e.g., SRAM, flash memory, electrically erasable programmable ROM (EEPROM), or the like, capable of meeting all the requirements as to non-volatility, rewriting rate, rewriting count, electric power consumption, and so on described above. There have been demands for new non-volatile devices having the above characteristics.

The semiconductor memory device 100 described above operates on a single power supply, e.g., 1.5 V power supply, has the advantages of SRAM and Fe RAM, and is able to transition at high speed and limitlessly between two modes, i.e., an active mode in which it operates as an SRAM and a sleep mode in which it holds data in a non-volatile manner as an FeRAM. Therefore, the semiconductor memory device 100 is highly suitable for use as a non-volatile device described above. Furthermore, the semiconductor memory device 100 is not limited to applications to IoT, but may also fulfil needs as register groups or main memories in logic circuits that are of a micro control unit (MCU)-less structure or include a combination of lightweight MCUs.

Other Modifications

In addition to the details of the above embodiments, various changes and modifications may be made in the various technical features disclosed in the present description without departing from the technical scope of the disclosure. In other words, the above embodiments should be interpreted as illustrative, but not restrictive, in all aspects. The technical scope of the present disclosure should be determined by the scope of claims, rather than the above description of the embodiments, and should be taken as covering all changes and modifications that are equivalent in meaning and scope to the scope of claims.

The disclosure disclosed in the present description can suitably be used as a data buffer for applications, e.g., sensor networks and biological monitoring where an active ratio is low, that may require standby power reduction in the sleep mode and maximization of sleep times.

It should be understood by those skilled in the art that various modifications, combinations, sub-combinations and alterations may occur depending on design requirements and other factors insofar as they are within the scope of the appended claims or the equivalent thereof.

The present disclosure contains subject matter related to that disclosed in Japanese Priority Patent Application JP 2018-088034 filed in the Japan Patent Office on May 1, 2018, the entire content of which is hereby incorporated by reference.

What is claimed is:

1. A semiconductor memory device, comprising:
a memory cell based on a static random access memory having one of a 6T configuration or a 4T2R configuration, wherein
the memory cell includes a first internal node, a second internal node, a first ferroelectric capacitor, and a second ferroelectric capacitor,
the first ferroelectric capacitor and the second ferroelectric capacitor have respective first ends connected respectively to the first internal node and the second internal node, and
to recover data stored in a non-volatile fashion in the first ferroelectric capacitor and the second ferroelectric capacitor, a first access transistor connected between the first internal node and a first bit line and a second access transistor connected between the second internal node and a second bit line are turned on, and respective capacitive components of the first bit line and the second bit line are used as load capacitances.

2. The semiconductor memory device according to claim 1, wherein the first access transistor and the second access transistor have respective control ends connected respectively to a first word line and a second word line that are separate from each other.

3. The semiconductor memory device according to claim 1, wherein the first ferroelectric capacitor and the second ferroelectric capacitor have respective second ends connected respectively to a first plate line and a second plate line that are separate from each other.

4. The semiconductor memory device according to claim 1, further comprising:
a local power supply line shared by a plurality of memory cells; and
a switching transistor connected between a power supply terminal and the local power supply line.

5. The semiconductor memory device according to claim 1, wherein
the memory cell further includes a pair of switching transistors connected respectively between a power supply terminal and one of a pair of drive transistors or a pair of load resistors.

6. The semiconductor memory device according to claim 1, wherein
the memory cell further includes a pair of switching transistors connected respectively between the first internal node and the second internal node and one of a pair of drive transistors or a pair of load resistors.

7. The semiconductor memory device according to claim 1, wherein
the memory cell further includes a single switching transistor connected in common between a power supply terminal and one of a pair of drive transistors or a pair of load resistors.

8. The semiconductor memory device according to claim 1, wherein
the memory cell further includes a pair of switching transistors connected respectively between the first internal node and the second internal node and a power supply terminal, and functions as load resistors when turned on.

9. The semiconductor memory device according to claim 1, further comprising:
a local ground line shared by a plurality of memory cells; and
a switching transistor connected between a ground terminal and the local ground line.

10. The semiconductor memory device according to claim 1, wherein
the memory cell further includes a pair of switching transistors connected respectively between a ground terminal and a pair of drive transistors.

11. The semiconductor memory device according to claim 1, wherein
the memory cell further includes a pair of switching transistors connected respectively between the first internal node and the second internal node and a pair of drive transistors.

12. The semiconductor memory device according to claim 1, wherein
the memory cell further includes a single switching transistor connected in common between a ground terminal and a pair of drive transistors.

13. The semiconductor memory device according to claim 1, further comprising:
a memory controller configured to control an access to the memory cell.

* * * * *